(12) United States Patent
Kamijo et al.

(10) Patent No.: US 10,802,315 B2
(45) Date of Patent: Oct. 13, 2020

(54) DISPLAY DEVICE

(71) Applicant: Japan Display Inc., Tokyo (JP)

(72) Inventors: Yoichi Kamijo, Tokyo (JP); Yoshikatsu Imazeki, Tokyo (JP); Shuichi Osawa, Tokyo (JP); Yoshihiro Watanabe, Tokyo (JP); Koichi Miyasaka, Tokyo (JP)

(73) Assignee: Japan Display, Inc., Tokyo (JP)

( * ) Notice: Subject to any disclaimer, the term of this patent is extended or adjusted under 35 U.S.C. 154(b) by 0 days.

(21) Appl. No.: 16/189,654

(22) Filed: Nov. 13, 2018

(65) Prior Publication Data

US 2019/0148668 A1 May 16, 2019

(30) Foreign Application Priority Data

Nov. 14, 2017 (JP) .................................. 2017-219265
Dec. 15, 2017 (JP) .................................. 2017-240550
Dec. 25, 2017 (JP) .................................. 2017-247924

(51) Int. Cl.
| | | |
|---|---|---|
| *G02F 1/1333* | (2006.01) | |
| *H01L 51/52* | (2006.01) | |
| *G02F 1/1335* | (2006.01) | |
| *H01L 27/32* | (2006.01) | |

(52) U.S. Cl.
CPC .. *G02F 1/133345* (2013.01); *G02F 1/133308* (2013.01); *G02F 1/133528* (2013.01); *H01L 27/3276* (2013.01); *H01L 51/5246* (2013.01); *G02F 2202/28* (2013.01); *H01L 51/5281* (2013.01)

(58) Field of Classification Search
CPC ............. H01L 51/5246; H01L 27/3276; H01L 51/5281; G02F 1/133528; G02F 1/133345; G02F 1/133308; G02F 2202/28; G02F 1/133608; G02F 2001/133311; G02F 2001/133314; G02F 2001/133317; G02F 2001/13332; G02F 2001/133322; G02F 2001/133325; G02F 2001/133328; G02F 2001/133331; G02F 2001/133334
USPC .................................................... 349/58–60
See application file for complete search history.

(56) References Cited

U.S. PATENT DOCUMENTS

| | | | | |
|---|---|---|---|---|
| 2009/0066862 | A1* | 3/2009 | Ishii | ................... G02F 1/133308 349/12 |
| 2011/0316810 | A1* | 12/2011 | Tsujino | ............... G02F 1/13338 345/174 |
| 2012/0168808 | A1* | 7/2012 | Lin | ..................... H01L 51/5246 257/99 |

(Continued)

FOREIGN PATENT DOCUMENTS

| | | |
|---|---|---|
| JP | 200240465 A | 2/2002 |
| JP | 2009237410 A | 10/2009 |

(Continued)

*Primary Examiner* — Shan Liu
(74) *Attorney, Agent, or Firm* — K&L Gates LLP

(57) ABSTRACT

According to one embodiment, a display device includes a display panel including a first surface over a display portion and a non-display portion therearound, a cover including a second surface opposing the first surface and an adhesive layer in contact with the first surface and the second surface, and the first surface includes a convexity projecting toward the cover in the non-display portion, and the second surface includes a concavity overlapping the convexity.

14 Claims, 31 Drawing Sheets

(56) References Cited

U.S. PATENT DOCUMENTS

| | | | |
|---|---|---|---|
| 2014/0293141 A1* | 10/2014 | Tsubokura | G02F 1/133308 349/1 |
| 2014/0375907 A1* | 12/2014 | Wu | G06F 3/0412 349/12 |
| 2015/0022753 A1* | 1/2015 | Akatsuka | G02F 1/133308 349/58 |
| 2015/0168767 A1* | 6/2015 | Yonemura | G02F 1/133308 349/58 |
| 2015/0263314 A1* | 9/2015 | Sakuishi | H01L 51/0097 438/28 |
| 2016/0034081 A1* | 2/2016 | Ichiki | G06F 3/044 345/173 |
| 2016/0254482 A1* | 9/2016 | Wang | H01L 51/524 257/88 |
| 2018/0210262 A1* | 7/2018 | Osawa | G02F 1/1345 |
| 2018/0213638 A1* | 7/2018 | Osawa | G02F 1/13338 |
| 2020/0096812 A1* | 3/2020 | Hinata | H05K 3/00 |

FOREIGN PATENT DOCUMENTS

| | | |
|---|---|---|
| JP | 2012211991 A | 11/2012 |
| JP | 2016058483 A | 4/2016 |
| JP | 2016063114 A | 4/2016 |

\* cited by examiner

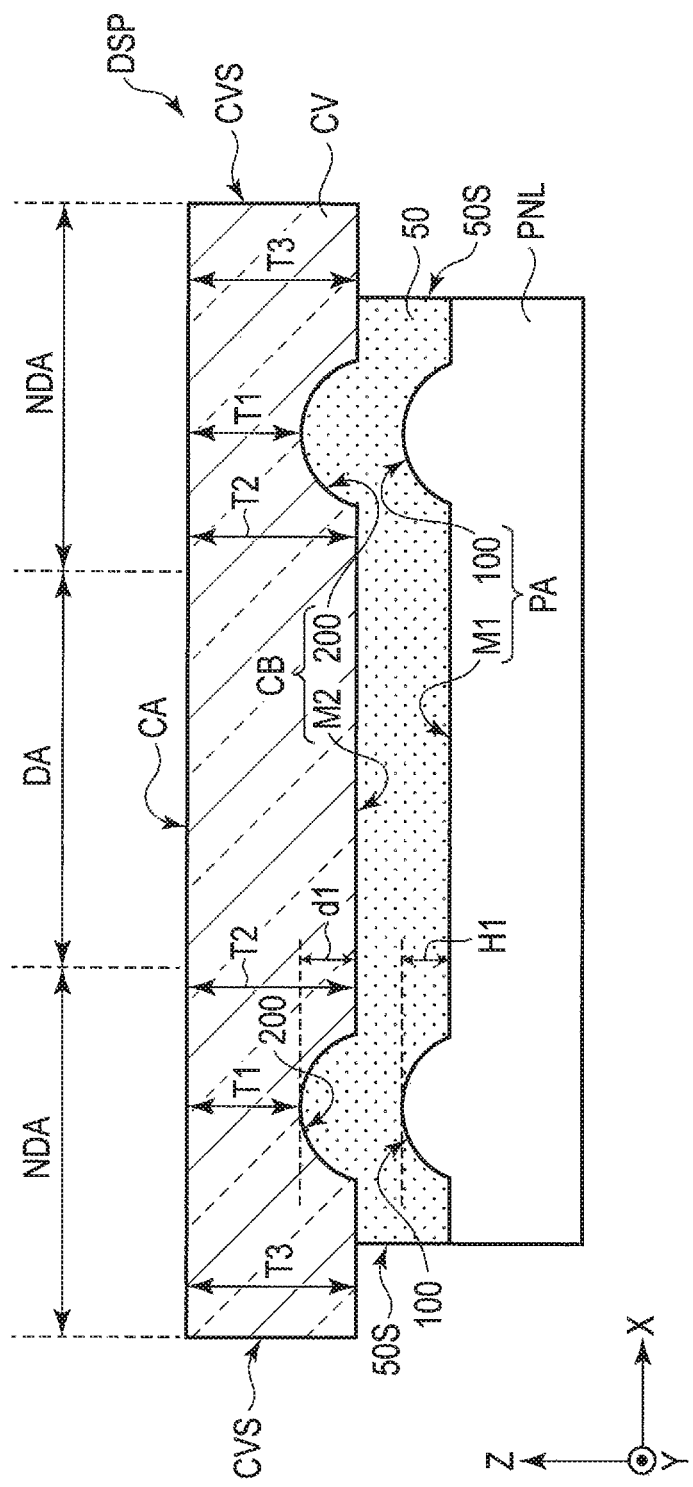
F I G. 1

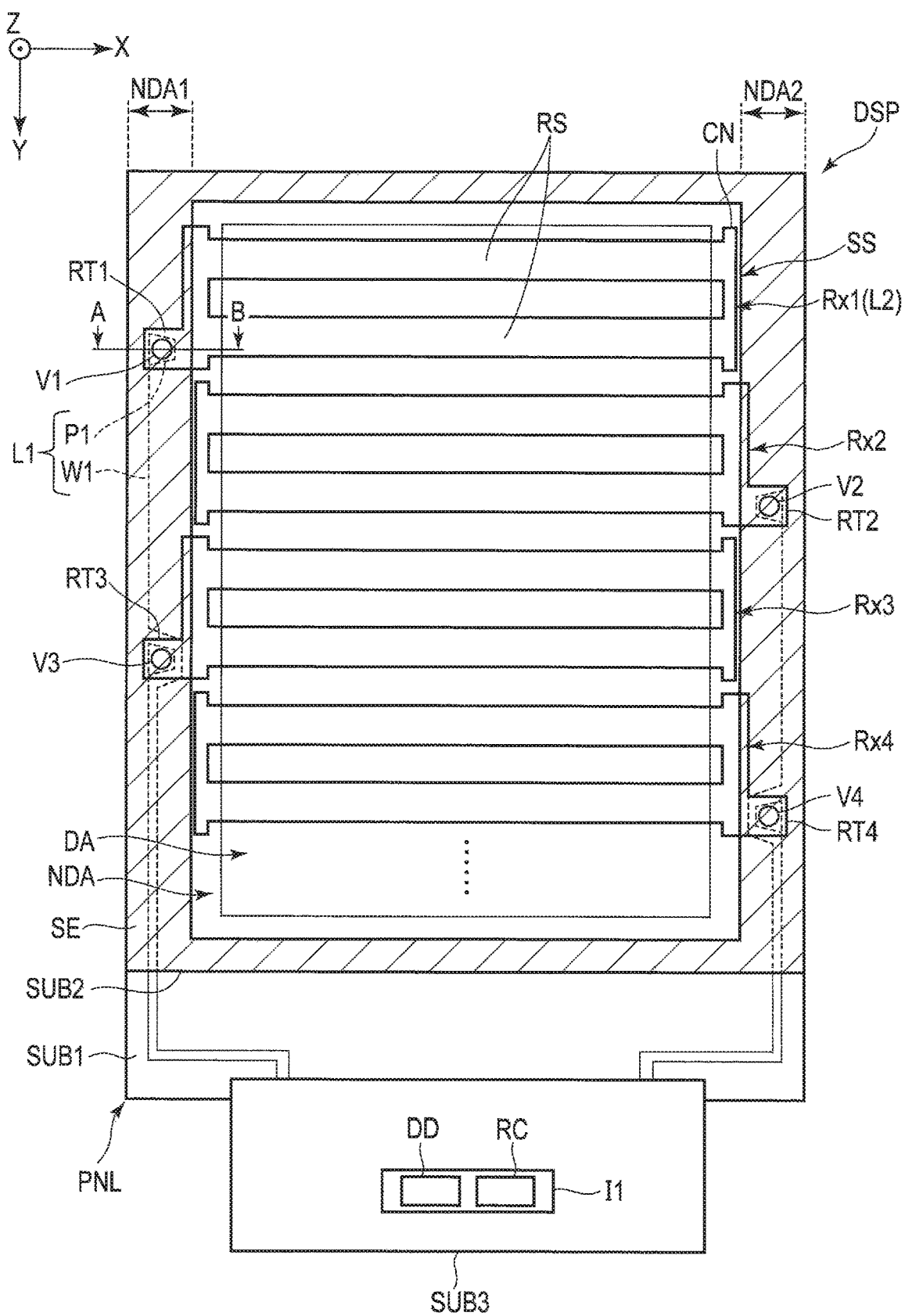
F I G. 3

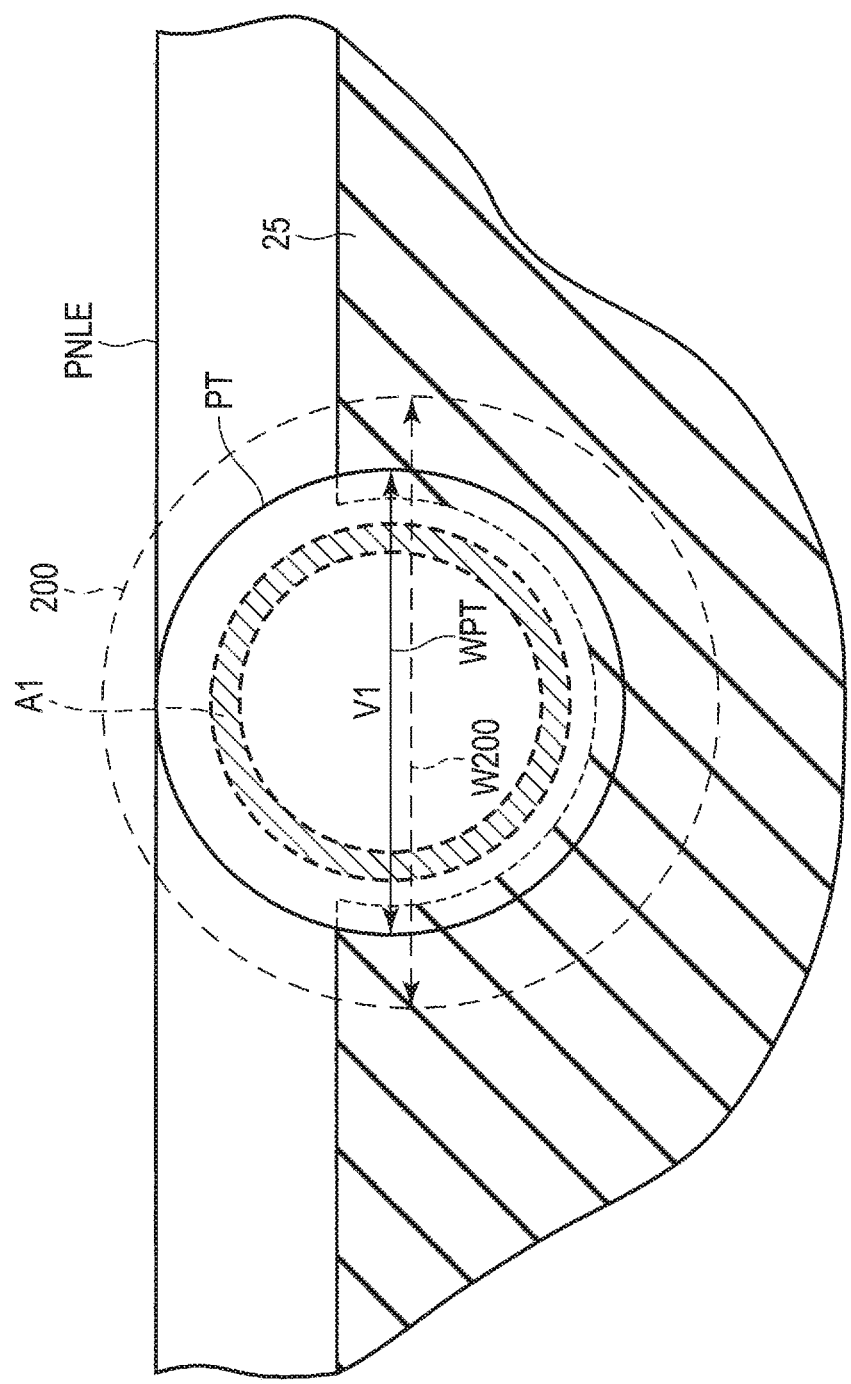
F I G. 6

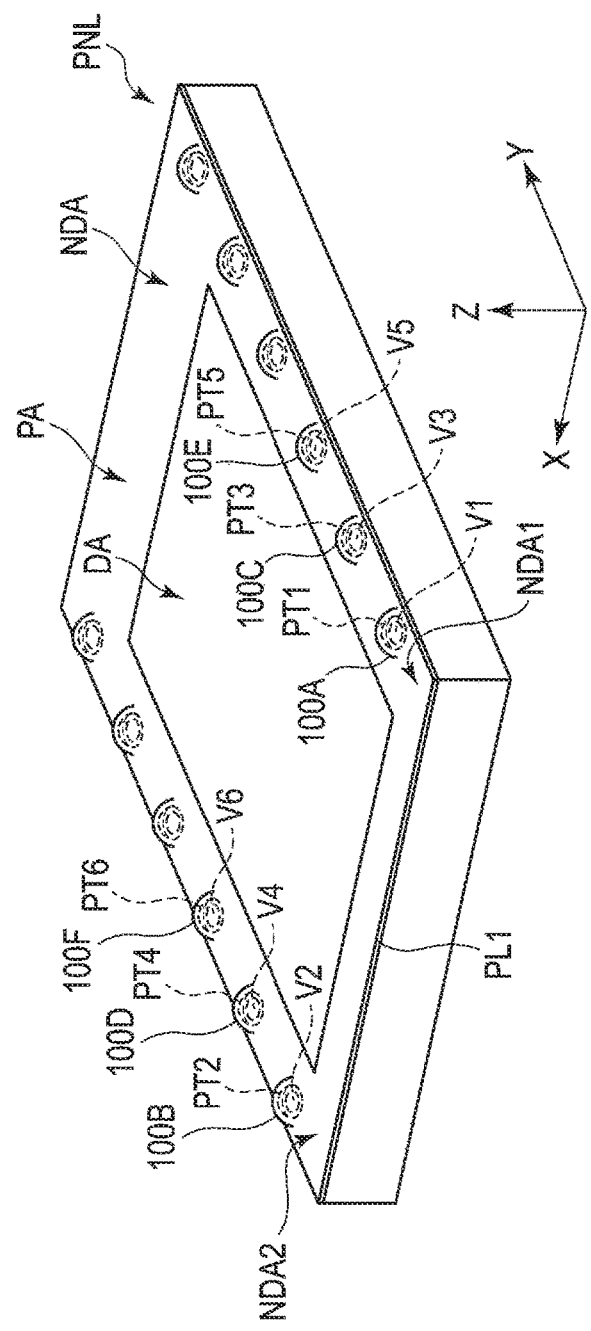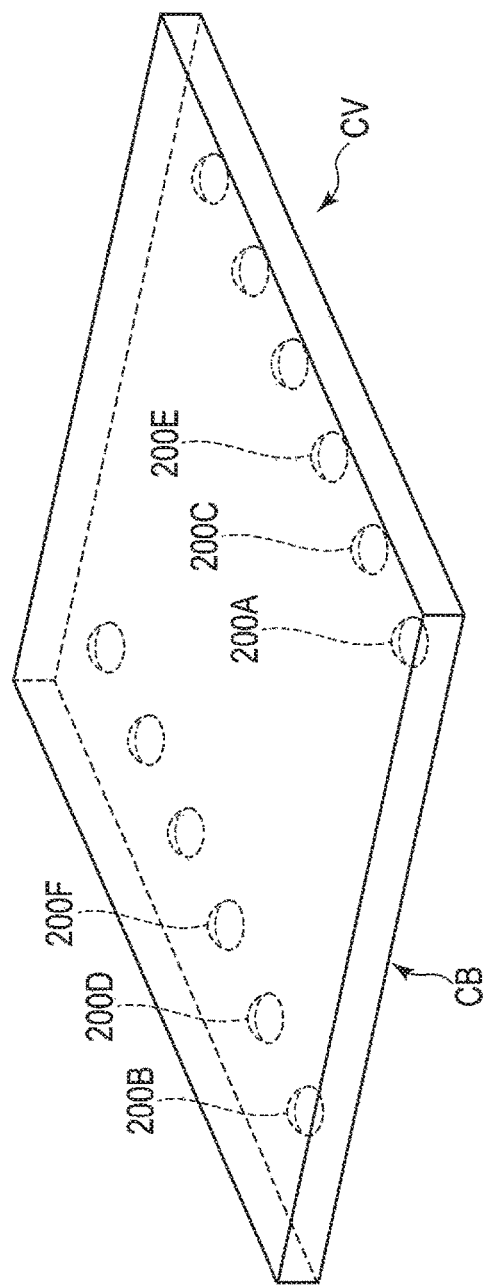
F I G. 10

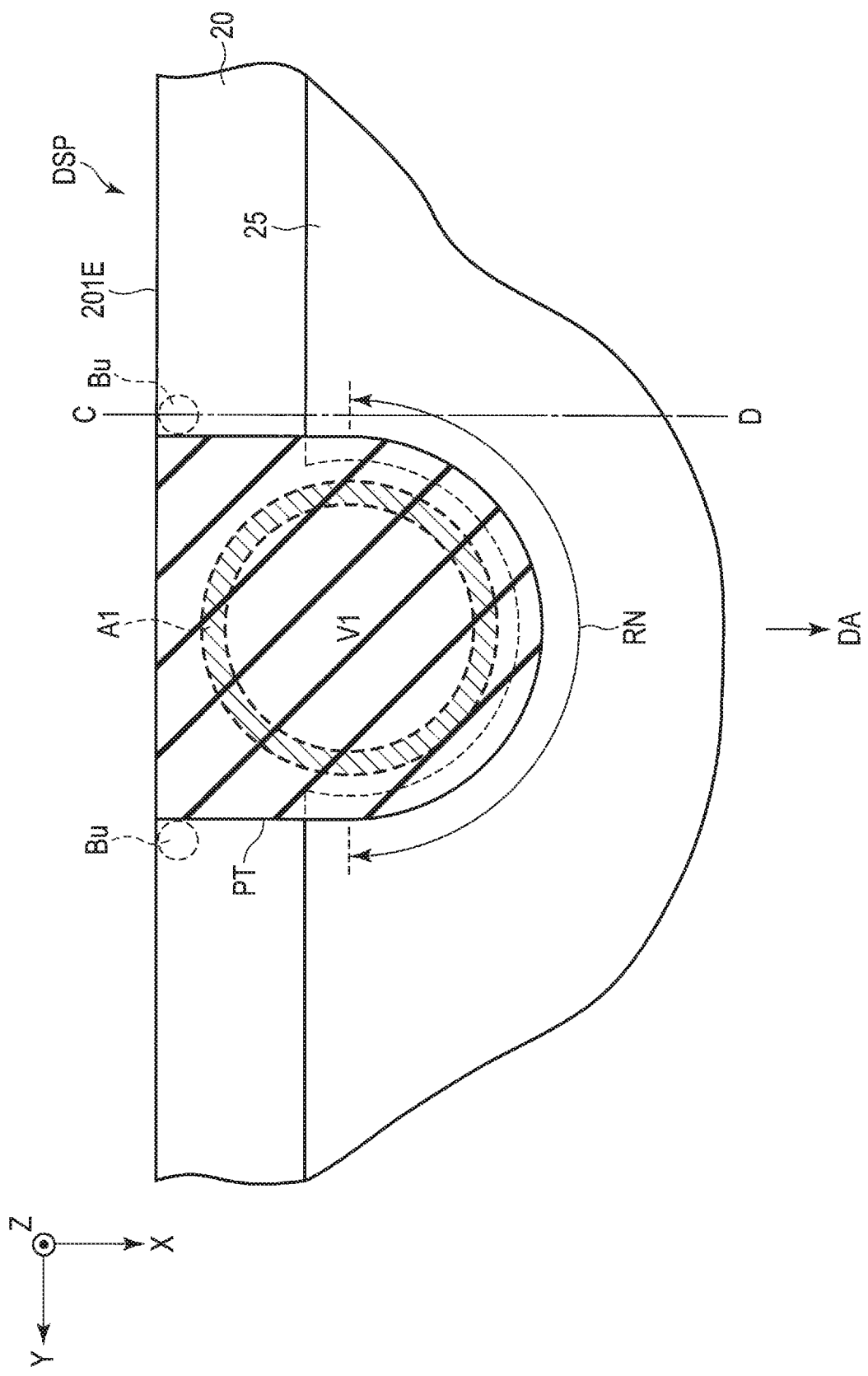
F I G. 14

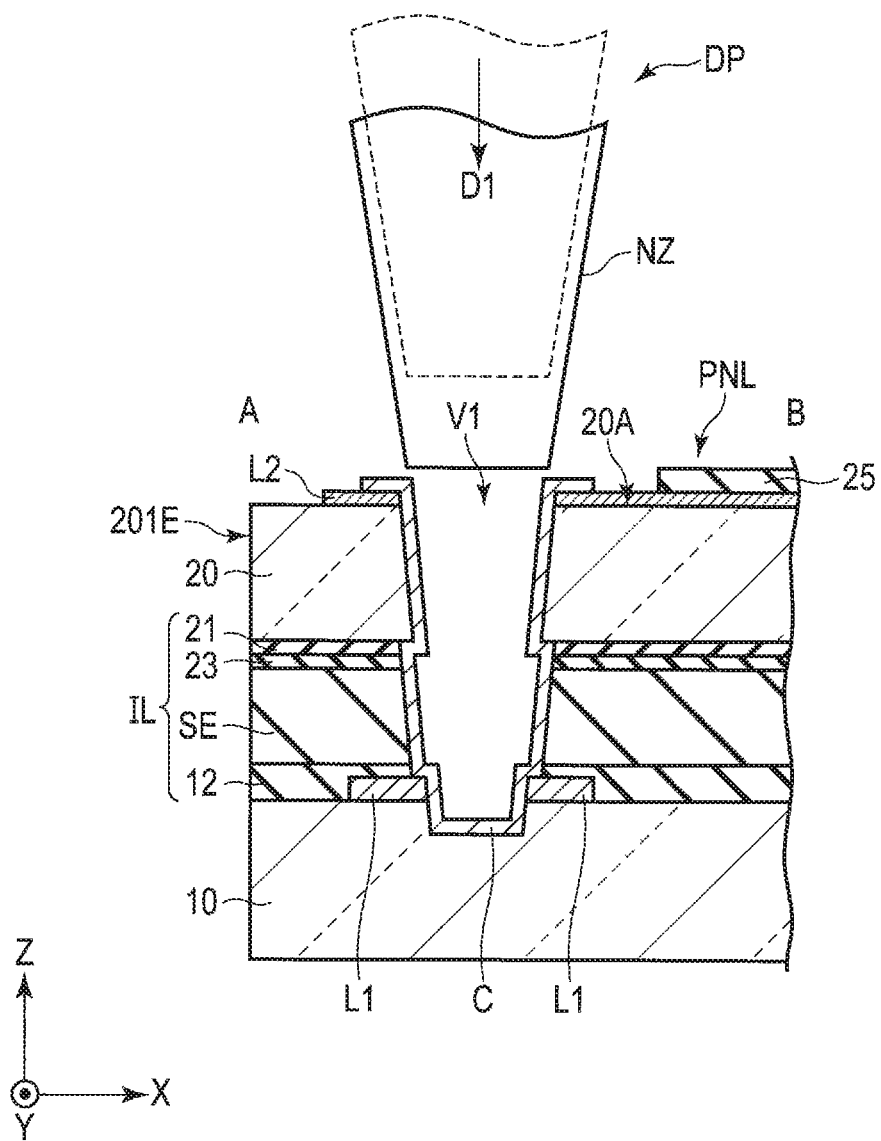
F I G. 16

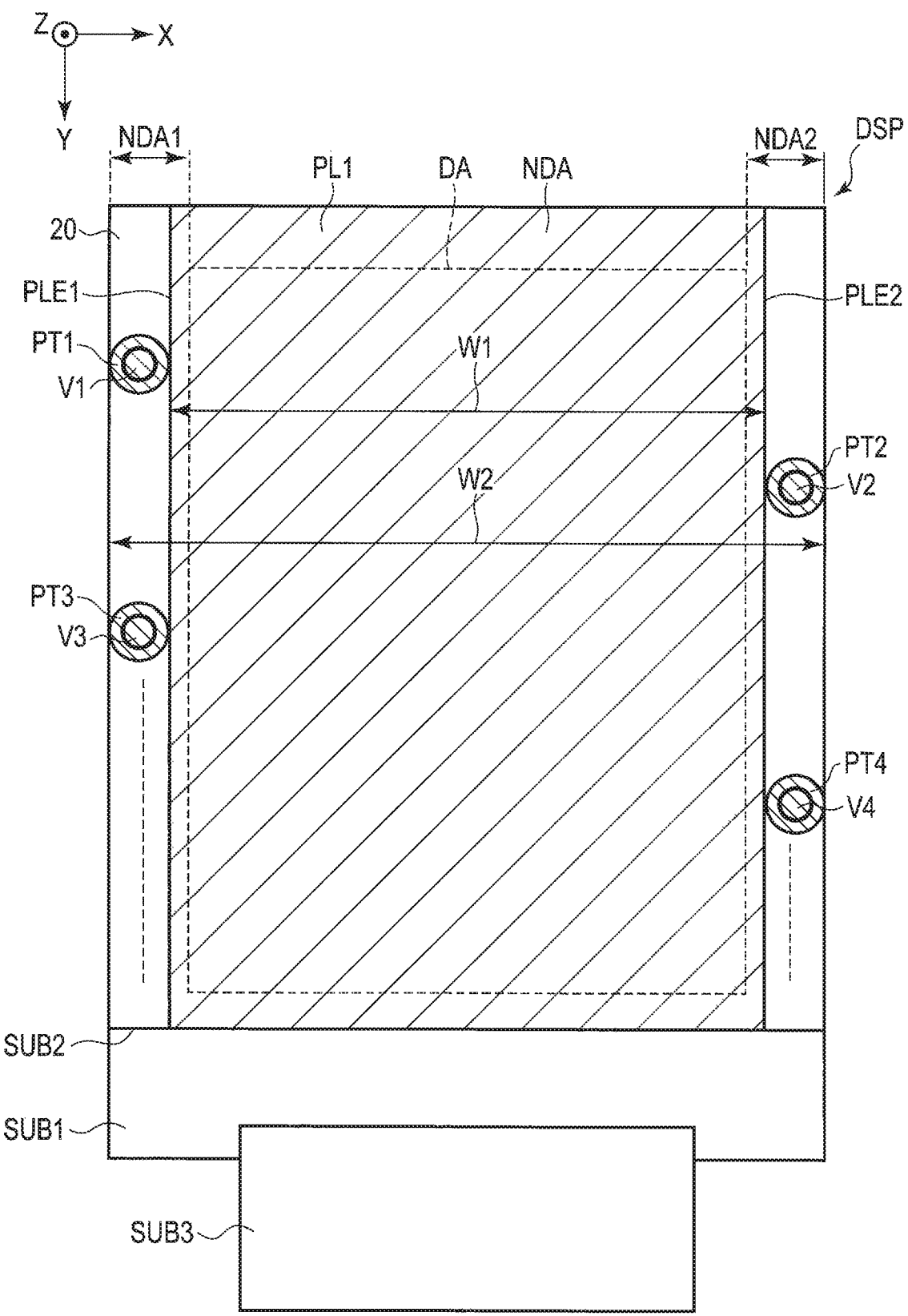
F I G. 24

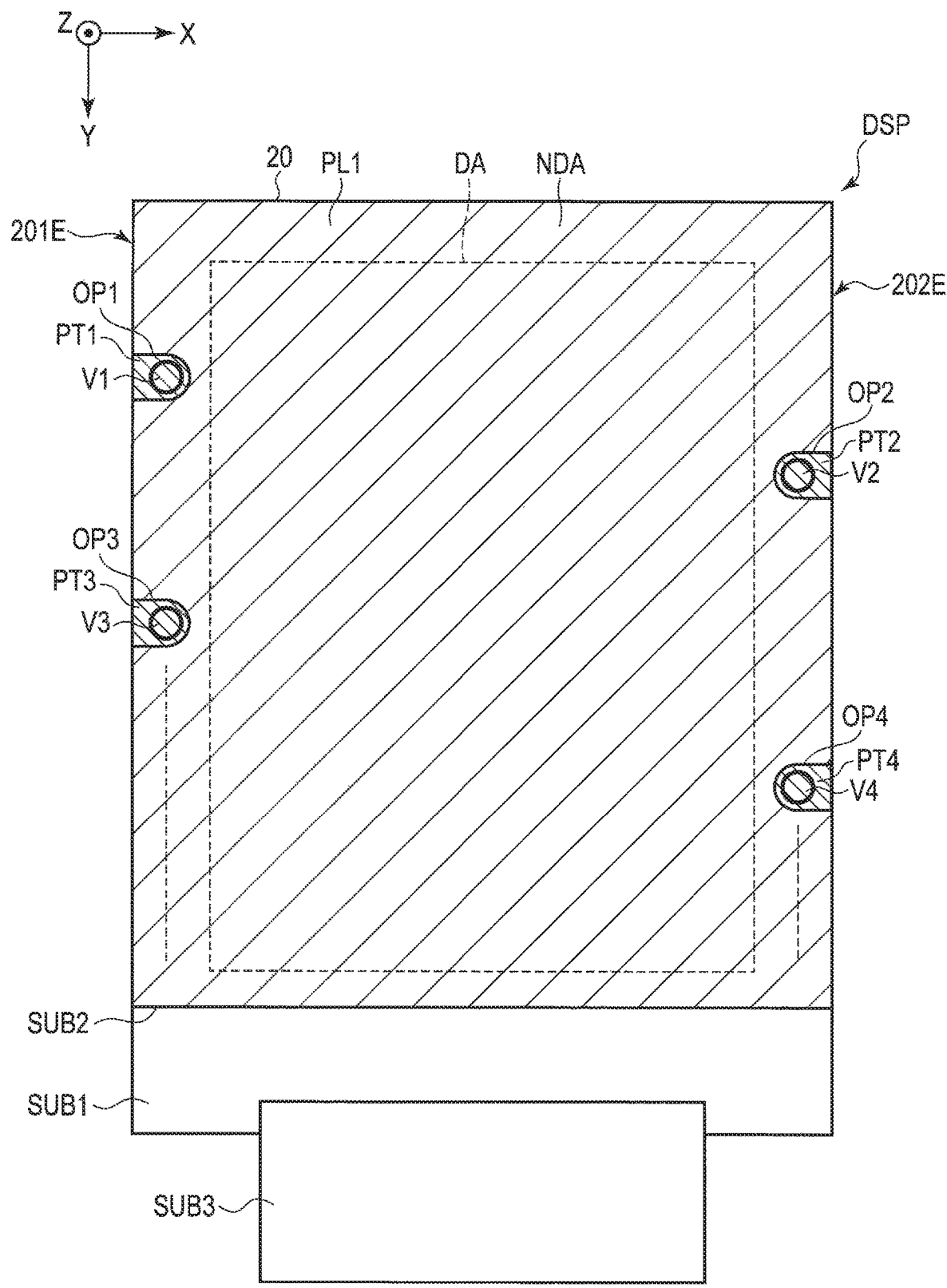
F I G. 30

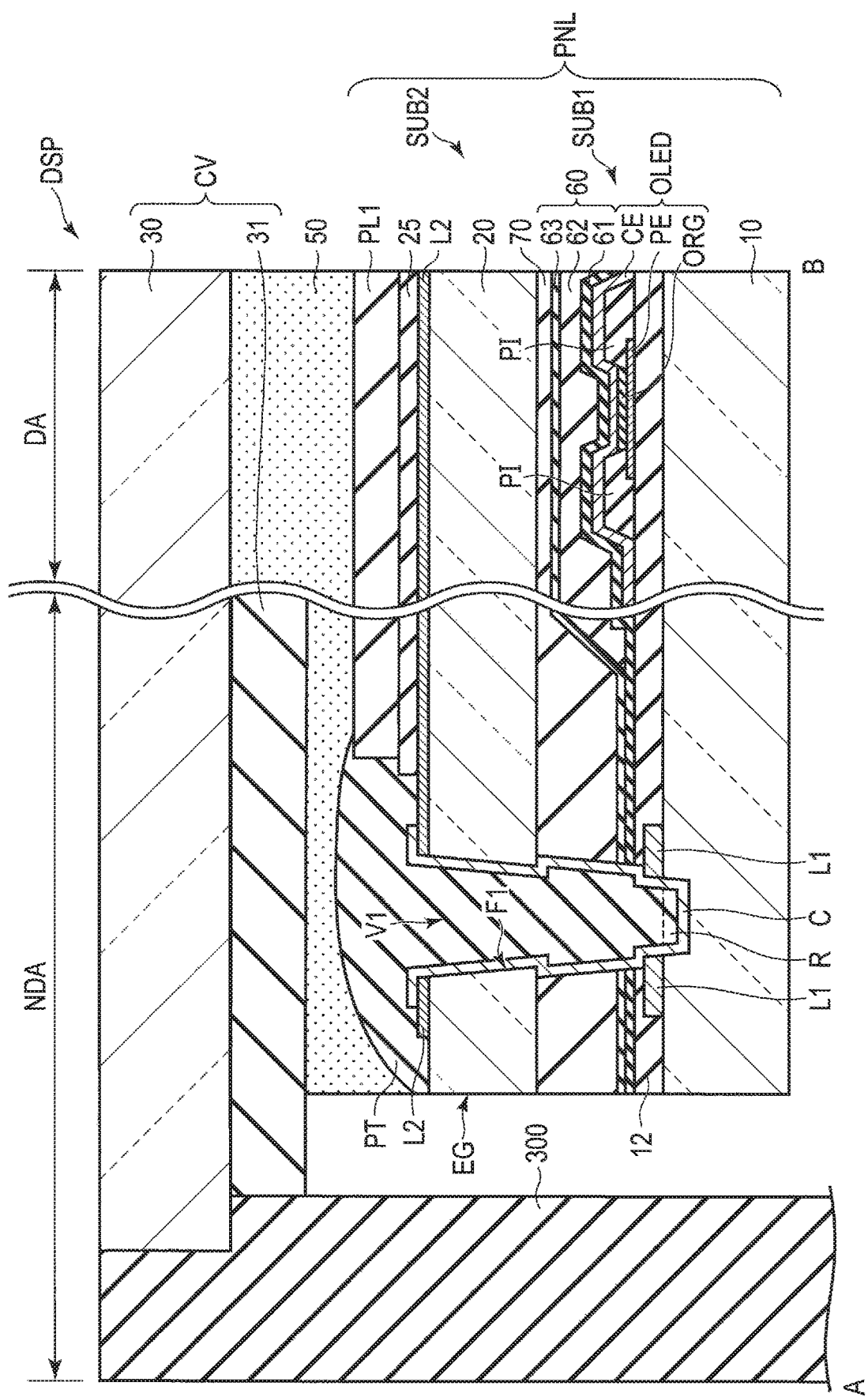
F I G. 31

DISPLAY DEVICE

CROSS-REFERENCE TO RELATED APPLICATIONS

This application is based upon and claims the benefit of priority from Japanese Patent Applications No. 2017-219265, filed Nov. 14, 2017; No. 2017-240550, filed Dec. 15, 2017; and No. 2017-247924, filed Dec. 25, 2017, the entire contents of all of which are incorporated herein by reference.

FIELD

Embodiments described herein relate generally to a display device including a cover.

BACKGROUND

Recently, various techniques for narrowing the frames of display devices have been studied. For example, such a technology is disclosed that a wiring line including an in-hole connector in a hole which penetrates an inner surface and an outer surface of a first substrate, and a wiring line provided on an inner surface of a second substrate are electrically connected to each other by an inter-substrate connector. Further, various techniques have been proposed for electrically connecting conductive layers provided on first and second surface of a substrate, respectively to each other by an electrode provided in a hole of the substrate.

SUMMARY

The present application generally relates to a display device.

According to one embodiment, a display device includes a display panel including a first surface over a display portion and a non-display portion therearound, a cover including a second surface opposing the first surface and an adhesive layer in contact with the first surface and the second surface, and the first surface includes a convexity projecting toward the cover in the non-display portion, and the second surface includes a concavity overlapping the convexity.

BRIEF DESCRIPTION OF THE DRAWINGS

FIG. 1 is a cross-sectional view schematically showing a display device DSP of a first embodiment.

FIG. 3 is a plan view showing the display device DSP of the first embodiment.

FIG. 6 is a plan view mainly showing a hole V1 in FIG. 5.

FIG. 10 is a cross-sectional view showing a fifth configuration example of the display device DSP of the first embodiment.

FIG. 14 is a plan view mainly showing a hole in FIG. 3.

FIG. 16 is a diagram illustrating a step in a method of manufacturing the display device of the second embodiment.

FIG. 24 is a plan view showing a shape of a polarizer shown in FIG. 23.

FIG. 30 is a cross-sectional view showing a third configuration example of the display device of the third embodiment.

FIG. 31 is a cross-sectional view showing a fourth configuration example of the display device of the third embodiment.

DETAILED DESCRIPTION

Figure 2:
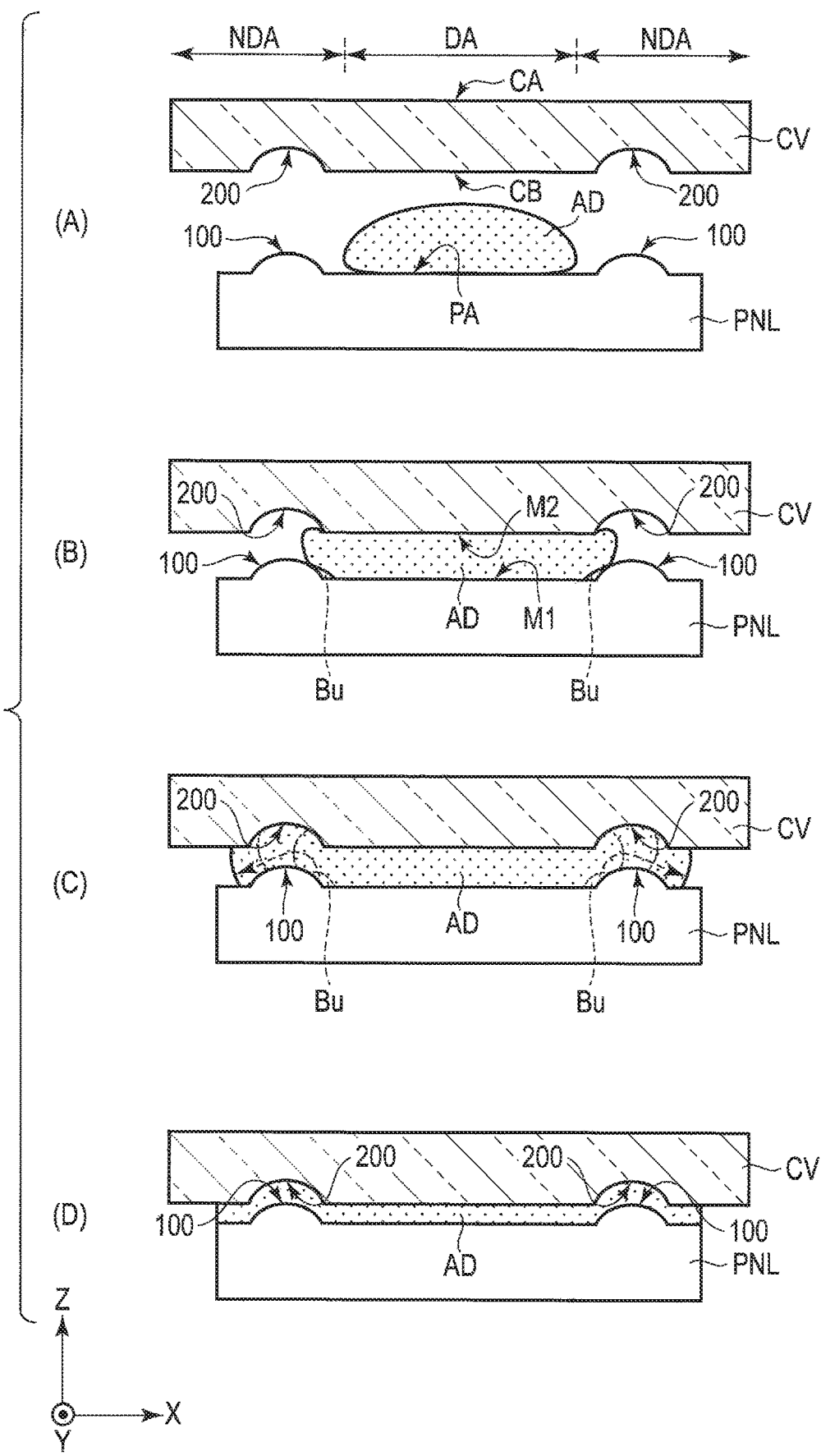
FIG. 2 is a diagram showing an example of a manufacturing process of the display device DSP in connection with adhesion of a cover CV and the display panel PNL.

In general, according to one embodiment, a display device includes a display panel including a first surface over a display portion and a non-display portion therearound, a cover including a second surface opposing the first surface and an adhesive layer in contact with the first surface and the second surface, and the first surface includes a convexity projecting toward the cover in the non-display portion, and the second surface includes a concavity overlapping the convexity.

According to another embodiment, a display device including a display panel including a display portion and a non-display portion around the display portion, adhesive layer disposed on the display panel, the display panel including, a first base; a second base, a first conductive layer located between the first base and the second base, an insulating layer located between the first conductive layer and the second base, a second conductive layer located on the second base, a hole penetrating the second base and the insulating layer; a connecting material electrically connecting the first conductive layer to the second conductive layer through the hole; a protective member covering the connecting material and projecting toward the adhesive layer; a polarizer disposed on the protective member, and the protective member having a first thickness on a side of the display portion with respect to the hole and a second thickness on an end portion side of the second base with respect to the hole, and the first thickness being less than the second thickness.

According to another embodiment, a display device including a display panel including a display portion and a non-display portion around the display portion, adhesive layer disposed on the display panel, the display panel including a first base, a second base disposed to oppose the first base; a first conductive layer located between the first base and the second base, an insulating layer located between the first conductive layer and the second base, a second conductive layer opposing the first conductive layer via the second base, a hole penetrating the second base and the insulating layer, a connecting material electrically connecting the first conductive layer to the second conductive layer through the hole, a protective member covering the connecting material and projecting toward the adhesive layer; and a polarizer on the second base, which covers at least the display portion, a height of the protective member from a surface of the second base being equivalent to or greater than a height of the polarizer from a surface of the second base. The embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. In addition, in some cases, in order to make the description clearer, the widths, thicknesses, shapes, etc., of the respective parts are schematically illustrated in the drawings and compared to the actual modes. However, the schematic illustration is merely an example, and adds no restrictions to the interpretation of the invention. In addition, in the specification and drawings, the structural elements, which have functions identical or similar to the functions described in connection with preceding drawings are denoted by like reference numbers, and an overlapping detailed description thereof is omitted unless otherwise necessary.

(First Embodiment)

The first embodiment will be provided.

FIG. 1 is a cross-sectional view schematically showing a display device DSP of the first embodiment. For example, a first direction X, a second direction Y and a third direction Z are orthogonal to each other, but they may cross each other at an angle other than 90°. The first direction X and the second direction Y are equivalent to a direction parallel to a main surface of a substrate which constitutes the display device DSP, and the third direction Z is equivalent to a thickness direction of the display device DSP. The figure shows the cross-section of a part of the display device DSP in an X-Z plane defined by the first direction X and the third direction Z. In this specification, a direction indicated by the tip of the arrow along the third direction Z is referred to as upward (or simply, up), and a direction opposite to that indicated by the tip of the arrow is referred to as downward (or simply, down). Further, when it is assumed that an observation position at which the display device DSP is to be observed is located at the pointing end side of the arrow indicating the third direction Z, a view toward an X-Y plane defined by the first direction X and the second direction Y is referred to as a plan view.

The display device DSP comprises a display panel PNL, a cover CV disposed on the display panel PNL, and an adhesive layer 50. The details of the display panel PNL and the cover CV will be provided later. The display panel PNL and the cover CV are attached to each other by the adhesive layer 50. The display device DSP includes a display area DA which displays images, and a non-display area NDA surrounding the display area DA.

The display panel PNL comprises a first surface PA extending over to the display area DA and the non-display area NDA. The first surface PA is an upper surface of the member located in an upper most layer of the display panel PNL. The first surface PA comprises a first main surface M1 equivalent to substantially its entire region and a plurality of convexities 100. The first main surface M1 is a flat surface substantially parallel to the X-Y plane, and is provided over the display area DA and the non-display area NDA. The convexity 100 projects toward a cover CV further from the first main surface M1 in the non-display area NDA. A height H1 of the convexity 100 is, for example, 5 to 20 μm and here it is 10 μm.

The cover CV is transparent at least in the display area DA. The cover CV comprises a second surface CB opposing the first surface PA, a third surface CA located in an opposite side to the second surface CB, and side surfaces CVS. The second surface CB is a lower surface of a member located in a lowermost layer of the cover CV. The second surface CB comprises the second main surface M2 substantially equivalent to its entire region, and a plurality of concavities 200. The second main surface M2 is a flat surface substantially parallel to the X-Y plane, and is located in the display area DA and the non-display area NDA. The concavity 200 is formed in a position overlapping the convexity 100. The concavity 200 is depressed towards the third surface CA from the second main surface M2. A depth d1 of the concavity 200 is, for example, 5 to 20 μm, and here it is 15 μm. The third surface CA is a flat surface substantially parallel to the X-Y plane.

The cover CV has a thickness (first thickness) T1 in the concavity 200, a thickness (second thickness) T2 on a display portion side with respect to the concavity 200 of the non-display area NDA, and a thickness T3 on a side surface CVS side with respect to the concavity 200 of the non-display area NDA. Note that the thicknesses described here are lengths between the second surface CB and the third surface CA along the third direction Z. The thickness T1 is less than the thickness T2. The thickness T1 is less than the thickness T3. The thickness T2 is less than the thickness T3 or equivalent to the thickness T3.

The adhesive layer 50 is transparent and in contact with each of the first surface PA and the second surface CB. More specifically, the adhesive layer 50 is located between the first main surface M1 and the second main surface M2 in the display area DA and the non-display area NDA. In the non-display area NDA, the convexity 100 included in the first surface PA is covered by the adhesive layer 50, and the concavity 200 included in the second surface CB is filled with the adhesive layer 50. Side surfaces 50S of the adhesive layer 50 are located on outer sides from the position where the convexity 100 and the concavity 200 overlap each other.

Next, one of advantageous effects of the first embodiment will be described.

FIG. 2 is a diagram showing an example of a manufacturing process of the display device DSP in connection with adhesion of the cover CV and the display panel PNL.

As shown in FIG. 2, part (A), an adhesive AD is applied on the first surface PA of the display panel PNL by using, for example, a dispenser. Then, the cover CV is pushed against the display panel PNL to attach the cover CV and the display panel PNL to each other. During this period, the adhesives AD spreads from the display area DA toward the non-display area NDA between the first surface PA and the second surface CB. Here, in some cases, as the adhesive AD expands to the convexity 100, air bubbles Bu are created around the convexity as shown in FIG. 2, part (B).

If the concavity 200 is not provided, gaps are created between the first main surface M1 and the second main surface M2. Here, the gap in the position overlapping the convexity 100 is narrower than the gap in the position where the first surface PA and the second surface CB oppose each other. Therefore, the adhesive AD spreading between first surface PA and the second surfaces CB increases its spreading speed rapidly in the position on around the convexity 100. During this period, the air bubbles Bu move outward as the adhesive AD spreads, but in some cases, the bubbles cannot catch up the spreading speed of the adhesives AD and they remain around the convexity 100. Even if such air bubbles Bu are located in the non-display area NDA, they may be viewed when the display area DA is observed from an oblique direction to the normal. As a result, the display quality may be degraded.

According to the first embodiment, the second surface CB of the cover CV has the concavity 200 in the position overlapping the convexity 100. With this structure, the adhesive AD spreading between the first surface PA and the second surfaces CB does not rapidly increase its spreading speed in the position on around the convexity 100. Therefore, as indicated by dotted lines in FIG. 2, part (C), the air bubbles Bu move outward together with the adhesive AD, and they move beyond the convexity 100 to pass to the outside. After that, as shown in FIG. 2, part (D), as the adhesive AD hardens, the cover CV is attached onto the display panel PNL without leaving the air bubbles Bu in the non-display area NDA. In this way, the decrease in display quality of the display device DSP can be inhibited. Note that the adhesive layer 50 shown in FIG. 1 is formed from the adhesive AD which has hardened.

FIG. 3 is a plan view showing the display device DSP of the first embodiment. Here, the cover CV and the adhesive layer 50 are omitted from the illustration, and a liquid crystal display device in which a sensor SS is mounted will be described as an example of the display device DSP. The display device DSP includes, in addition to the display panel PNL, an IC chip I1 and a wiring substrate SUB3. The display panel PNL includes a first substrate SUB1, a second substrate SUB2 and a sealant SE. The second substrate SUB2 opposes the first substrate SUB1. The sealant SE it is equivalent to a portion indicated by hatch lines in FIG. 3, and adheres the first substrate SUB1 and the second substrate SUB2 together and seals the liquid crystal layer (not shown). The display area DA is located in an inner region surrounded by the sealant SE. The sealant SE is located in the non-display area NDA.

The IC chip I1 is mounted on the wiring substrate SUB3. The arrangement is not limited to that of the example illustrated, but the IC chip I1 may be mounted on a portion of the first substrate SUB1, which extends out from the second substrate SUB2, and may be mounted on an external circuit board connected to the wiring substrate SUB3. The IC chip I1 incorporates, for example, a display driver DD which outputs signals necessary to display images. In the example illustrated, the IC chip I1 incorporates a detection circuit RC which functions as a touch panel controller or the like. The detection circuit RC may be incorporated in some other IC chip different from the IC chip I1.

The display panel PNL may be any one of a transmissive type equipped with a transmissive display function which displays images by, for example, selectively transmitting from underneath the first substrate SUB1, a reflective type equipped a reflective display function which displays images by selectively reflecting light from above the second substrate SUB2 and a trans-reflective type equipped with both the transmissive display function and the reflective display function.

The sensor SS senses if an object to be detected is in contact with or in proximity to the display device DSP. The sensor SE comprises a plurality of detection electrodes Rx (Rx1, Rx2, . . . ). The detection electrodes Rx are provided in the second substrate SUB2, and are equivalent to a second conductive layer L2 shown in FIG. 5. The detection electrodes Rx each extend along the first direction X, and are arranged to be spaced apart from each other along the second direction Y.

The detection electrode Rx1 comprises detectors RS, a terminal RT1 and a connector CN. The detectors RS are located in the display area DA and extend along the first direction X. The detectors RS are mainly used for sensing. In the example illustrated, the detectors RS are formed into a belt-like shape, but more specifically, they are formed of an aggregate of fine metal thin wires in the form of a mesh, a wave, a sawtooth, a sine wave and the like.

The terminal RT1 is located on one end portion NDA1 of the non-display area NDA along the first direction X and is connected to the detectors RS. The connector CN is located on an other end portion NDA2 of the non-display area NDA along the first direction X and connects the detectors RS to each other. In FIG. 3, the one end portion NDA1 is equivalent to a region on a further left-hand side from the display area DA, and the other end portion NDA2 is equivalent to a region on a further right-hand side from the display area DA. A part of the terminal RT1 is formed in a position which overlaps the sealant SE in plan view.

In contrast, the first substrate SUB1 includes a pad P1 and a wiring line W1 corresponding to the first conductive layer L1. The pad P1 and the conductive line W1 are located on the one end portion NDA1 of the non-display area NDA, to overlap the sealant SE in planar view. The pad P1 is formed in a position which overlaps the terminal RT1 in plan view. The wiring line W1 is connected to the pad P1 to extend along the second direction Y, and is electrically connected to the detection circuit RC of the IC chip I1 via the wiring substrate SUB3.

Figure 5:
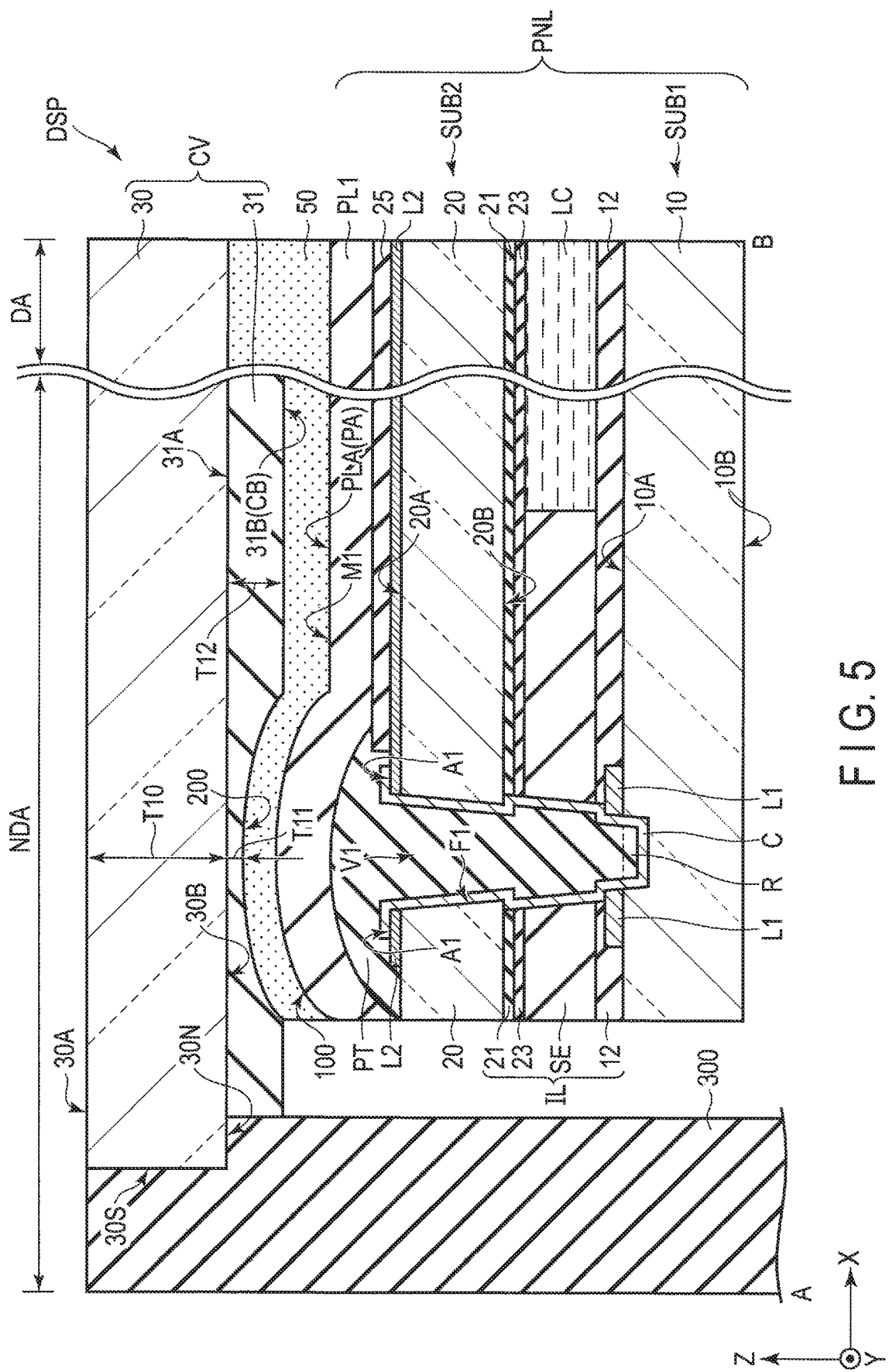
FIG. 5 is a cross-sectional view showing a configuration example of the display device DSP of the first embodiment.

A contact hole V1 is formed at a position where the terminal RT1 opposes the pad P1. The connecting material C shown in FIG. 5 is formed in the hole V1. Accordingly, the terminal RT1 and the pad P1 are electrically connected to each other. That is, the detection electrode Rx1 provided in the second substrate SUB2 is electrically connected to the wiring line W1 of the first substrate SUB1 via a conductive structure between the substrates, which comprises the terminal RT1, the connecting material C provided in the hole V1 and the pad P1, and electrically connected to the detection circuit RC via the wiring substrate SUB3 connected to the first substrate SUB1. The detection circuit RC reads sensor signals output from the detection electrodes Rx, and detects whether there is an object to be detected in contact or approaching, position coordinates of the object, and the like.

In FIG. 3, the terminals RT1, RT3, . . . , of the odd-numbered detection electrodes Rx1, Rx3, . . . , and the holes V1, V3, . . . , formed at positions opposing the terminals RT1, RT3, . . . , respectively, are located in the one end portion NDA1. The terminals RT2, RT4, . . . , of the even-numbered detection electrodes Rx2, Rx4, . . . , and the holes V2, V4, . . . , formed at positions opposing the terminals RT2, RT4, . . . , respectively, are located in the other end portion NDA2.

Figure 4:
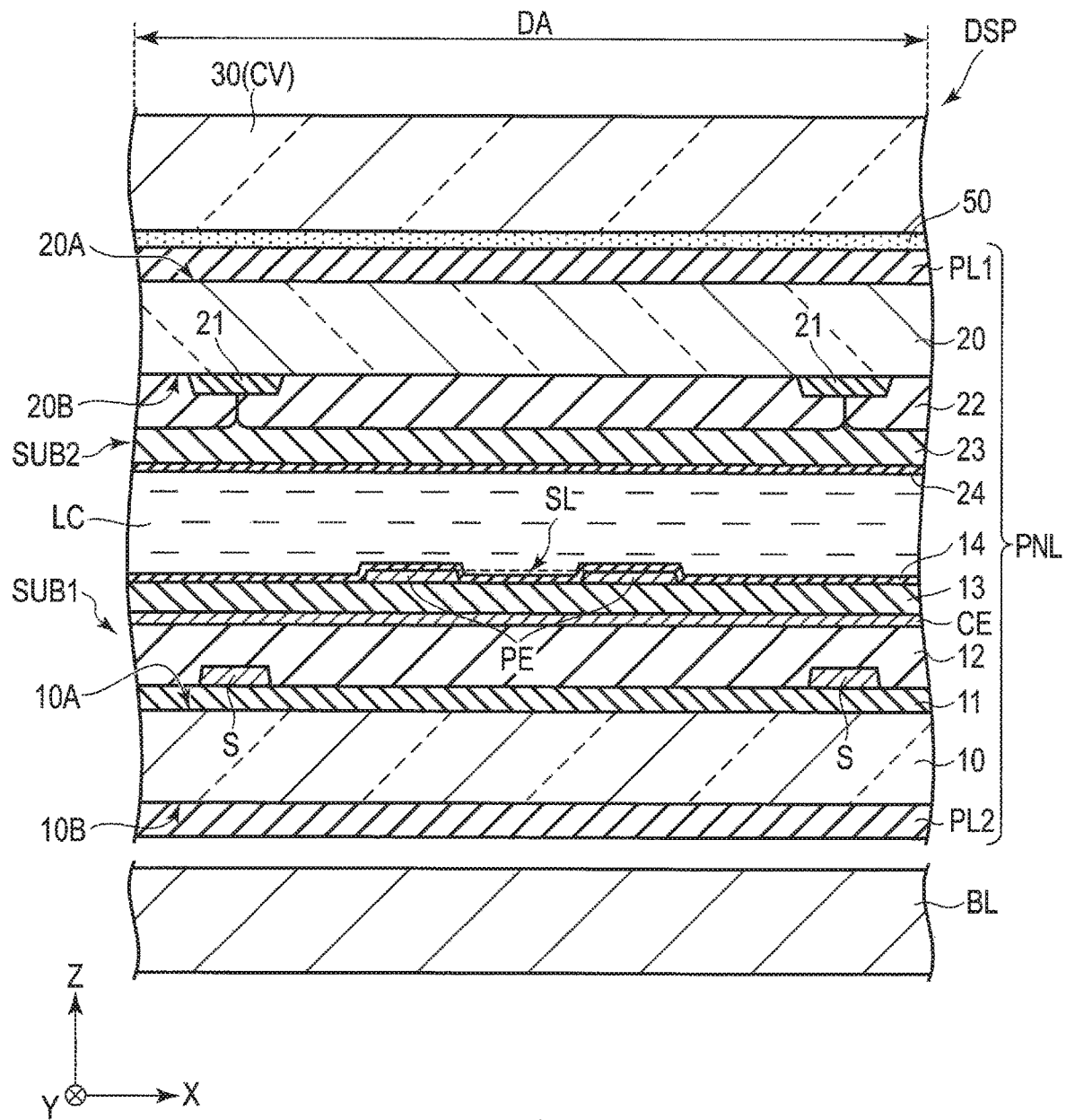
FIG. 4 is a cross-sectional view schematically showing a display area DA of the display device DSP shown in FIG. 3.

FIG. 4 is a cross-sectional view schematically showing the display area DA of the display device DSP of FIG. 3. The cross section shown here is of one pixel of the display device DSP sliced along the first direction X.

The first substrate SUB1 comprises a first base 10, signal lines S, a common electrode CE, a pixel electrode PE, a first insulating layer 11, a second insulating layer 12, a third insulating layer 13, a first alignment film 14 and the like. Here, only the main structure is illustrated and various insulating layers, etc., are omitted.

The first base 10 is formed of, for example, non-alkali glass, transparent resin or the like, and comprises an upper surface 10A on a side opposing the second substrate SUB2 and a lower surface 10B on an opposite side to the upper surface 10A. The first insulating layer 11 is provided on the first surface 10A. The signal lines S are provided on the first insulating layer 11. The second insulating layer 12 is provided on the signal lines S and the first insulating layer 11. The common electrode CE is provided on the second insulating layer 12. The third insulating layer 13 is provided on the common electrode CE. The pixel electrode PE is provided on the third insulating layer 13. The pixel electrode PE opposes the common electrode CE via the third insulating layer 13. In the example illustrated, the pixel electrode PE comprises one slit SL. The first alignment film 14 covers the pixel electrode PE and the third insulating layer 13.

The common electrode CE and the pixel electrode PE is formed of, for example, a transparent conductive material such as indium tin oxide (ITO) or indium zinc oxide (IZO).

The second substrate SUB2 comprises a second base 20, light-shielding layers 21, color filters 22, an overcoat film 23, a second alignment film 24 and the like.

The second base 20 is disposed to oppose the first base 10 and is located on a cover CV side with respect to the first base 10. The second base 20 is formed of, for example, non-alkali glass, transparent resin or the like, and comprises an upper surface 20A on a side opposing the adhesive layer 50 and a lower surface 20B on a side opposing the first substrate SUB1. The light-shielding layers 21 and the color filters 22 are disposed under the lower surface 20B. The light-shielding layers 21 are disposed for partition to form pixels and are located directly above the respective signal lines S. The color filters 22 opposes the pixel electrode PE and partially overlap the light-shielding layer 21. The overcoat layer 23 covers the color filters 22. The second alignment film 24 covers the overcoat layer 23. The liquid crystal layer LC is disposed between the first alignment film 14 and the second alignment film 24. Note that the color filter 22 may be disposed on the first substrate SUB1.

The display panel PNL comprises a polarizer PL1 and a polarizer PL2. The polarizer PL1 is located between the second base 20 and the third base 30 of the cover CV and along the upper surface 20A, and adhered on the detection electrodes Rx, which are omitted from illustration. The polarizer PL2 is located between the first base 10 and an illumination device BL, and adhered onto the lower surface 10B.

FIG. 5 is a cross-sectional view showing a first configuration example of the display device DSP of the first embodiment. The cross section of the display device DSP is taken along line A-B in FIG. 3, and the elements of the first substrate SUB1 and the second substrate SUB2, the illumination device BL and the polarizer PL2 shown in FIG. 4 are omitted for the sake of convenience.

In the example of FIG. 5, the second insulating layer 12 is disposed between the sealant SE and the first base 10, and the light-shielding layer 21 and the overcoat layer 23 are disposed between the sealant SE and the second base 20. The sealant SE, the second insulating layer 12, the light-shielding layer 21 and the overcoat layer 23 constitute an insulating layer IL, which is, for example, an organic insulating layer. The insulating layer IL is located between the first conductive layer L1 and the second base 20. Note that the insulating layer IL may further include the first alignment film 14, the second alignment film 24 and the like, shown in FIG. 4. The first substrate SUB1 includes the first conductive layer L1. The first conductive layer L1 is located between the first base 10 and the second base 20. The first conductive layer L1 is formed on the upper surface 10A and is covered by the second insulating layer 12. The first conductive layer L1 is formed of a metal material, an alloy of metal materials, or a transparent conductive material such as ITO or IZO.

The second substrate SUB1 includes the second conductive layer L2. The second conductive layer L2 is formed on the upper surface 20A. The second conductive layer L2 opposes the first conductive layer L2 via the second base 20. Note that an insulating layer may be interposed between the second conductive layer L2 and the second base 20. The second conductive layer L2 may be formed of a metal-containing conductive layer or a transparent conductive material such as ITO or IZO. The insulating overcoat layer 25 is formed on the second conductive layer L2.

The hole V1 penetrates the second base 20 between the upper surface 20A and the lower surfaces 20B. Further, the hole V1 penetrates each of the overcoat layer 25, the second conductive layer L2, the insulating layer IL and the first conductive layer L1. The first base 10 comprises a concavity R communicated to the hole V1. The second conductive layer L2 includes a first area A1 exposed from the overcoat layer 25 around the hole V1.

The connecting material C is provided continuously over on an inner surface F1 of the hole V1, the concavity R, and the area A1 without any interval. For example, as the connecting material C, a material obtained by mixing particles of a metal material such as silver into a solvent is used. Here, the particle diameter of such a metal material should preferably be the order of several to tens of nanometers. The conductive material C is in contact with the first conductive layer L1 in the inner surface F1. The conductive material C is in contact with the second conductive layer L2 in the inner surface F1 and the first area A1. Thus, the first conductive layer L1 and the second conductive layer L2 are electrically connected to each other by the connecting material C.

Note that the solvent evaporates in the production process, as the connecting material, only the metal material is adhered onto the wall surface of the hole.

A protective member PT is formed in the hole V1 and on the second base 20 to cover the connecting material C and to fill the hole V1. The protective member PT covers an end portion of the connecting material C, which is located on the area A1. Further, the protective member PT overlaps the overcoat layer 25 near the connecting material C. The protective member PT is formed to project toward the cover CV with respect to the overcoat layer 25. The protective member PT is formed of, for example, an organic insulating material. The protective member PT inhibits the entering of moisture from outside, thereby suppressing the corrosion of each portion exposed to the hole V1 and the connecting material C. Further, the protective member PT inhibits the reflection of external light by the connecting material C. In view of this, such a structure that black pigments and the like are mixed into the protective member PT may as well be employed.

The polarizer PL1 is disposed above the second base 20 and is adhered onto the protective member PT and the overcoat layer 25. The polarizer PL is provided on the display area DA and over to the non-display area NDA. The polarizer PL1 is located between the adhesive layer 50 and the protective member PT, and comprises an upper surface PLA in contact with the adhesive layer 50. That is, the polarizer PL1 is equivalent to a member located in the uppermost layer of the display panel PNL. The upper surface PLA is equivalent to the first surface PA of the display panel PNL shown in FIG. 1, etc. Since the protective member PT projects, the upper surface PLA of the polarizer PL1 projects to a cover CV side in a position overlapping the hole V1. More specifically, the polarizer PL1 partially projects due to a difference in level created by the underlying protective member PT and overcoat layer 25. A portion projecting from the upper surface PLA is equivalent to a convexity 100. The convexity 100 is formed in a position overlapping the protective member PT. A region of the upper surface PLA, which overlaps the overcoat layer 25 is substantially flat, and is equivalent to the first main surface M1. Note that the thickness of polarizer PL1 is constant, and therefore the polarizer PL1 itself does not include the convexity 100.

The cover CV comprises the third base 30 and a coloring layer 31. The third base 30 is formed of, for example, insulating glass, transparent resin or the like. The third base 30 comprises an upper surface 30A, a lower surface 30B, and a side surface 30S. The third base 30 has a constant thickness T10 in the display area DA and the non-display area NDA.

The coloring layer 31 is formed in the non-display area NDA, and is located between the third base 30 and the adhesive layer 50. Note that the coloring layer 31 is not formed in the display area DA. The coloring layer 31 comprises the upper surface 31A in contact with the third base 30 and the lower surface 31B in contact with the adhesive layer 50. That is, the coloring layer 31 is equivalent to a member located in a lowermost layer of the cover CV. The lower surface 31B is equivalent to the second surface CB of the cover CV shown in FIG. 1 and the like. The lower surface 31B is depressed towards a side spaced away from the display panel PNL in a position overlapping the convexity 100. That is, in the first configuration example, the concavity 200 of the cover CV is formed by taking advantage of that the thickness of the coloring layer 31 varies. That is, the coloring layer 31 has a thickness (third thickness) T11 in the concavity 200, and has a thickness (fourth thickness) T12 around the concavity 200 in the non-display area NDA. The thickness T11 is less than the thickness T12. For example, the thickness T12 is about 30 μm and the thickness T11 is 15 to 20 μm For example, the coloring layer 31 which has such thicknesses T11 and T12 as described above can be formed by applying resin materials multiple times using masks of different opening sizes. Note that the coloring layer 31 is not formed on a region 30N of the lower surface 30B, which is located near the side surface 30S. A frame 300 is in contact with each of the region 30N of the lower surface 30B and the side surface 30S, and is fixed with the cover CV The cover CV with such a structure, a total of the thickness T10 and the thickness T11 is equivalent to the thickness T1 shown in FIG. 1, and a total of the thickness T10 and the thickness T12 is equivalent to the thickness T2 shown in FIG. 1.

The adhesive layer 50 is in contact with the upper surface PLA and the lower surface 31B in the non-display area NDA, so as to cover the convexity 100 and fill the concavity 200. Further, the adhesive layer 50 is in contact with the lower surface 30B in the display area DA.

FIG. 6 is a plan view illustrating the hole V1 shown in FIG. 5. The hole V1 is formed circular in plan view. Of the second conductive layer L2, the area A1 is formed into a ring shape which surrounds the hole V1 all along its entire circumference. The protective member PT overlaps the hole V1 and the area A1. In the example illustrated, the protective member PT is formed to reach a display panel end PNLE. The concavity 200 is formed in a position overlapping the protective member PT indicated by the dotted line. The protective member PT has a width WPT less than a width W200 of the concavity 200.

Figure 7:
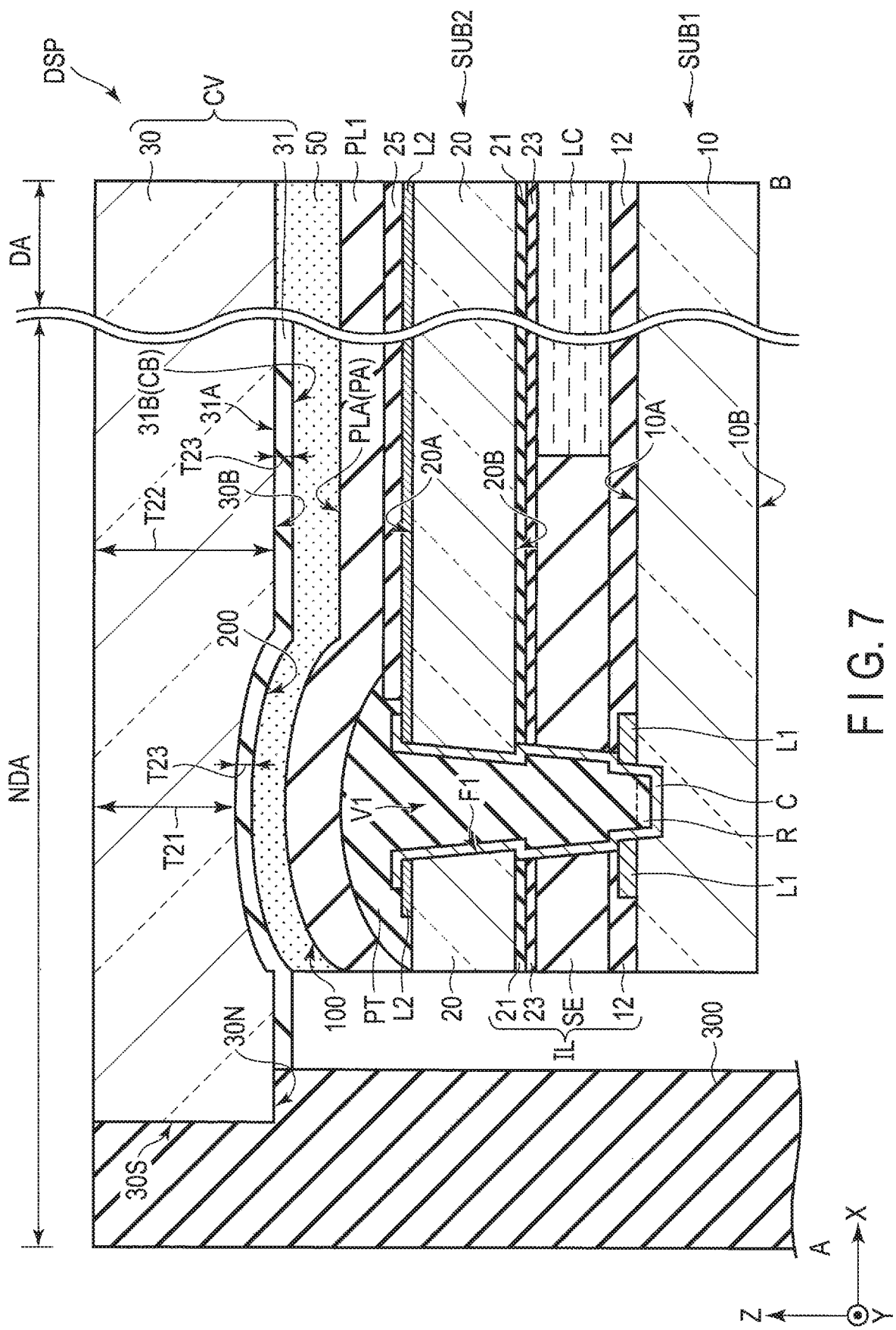
FIG. 7 is a cross-sectional view showing a second configuration example of the display device DSP of the first embodiment.

FIG. 7 is a cross-sectional view showing a second configuration example of the display device DSP of the first embodiment. The second configuration example shown in FIG. 7 is different from the first configuration example shown in FIG. 5 in that the lower surface 30B of the third base 30 is depressed to the side spaced away from the display panel PNL in the position overlapping the convexity 100. The second configuration example is identical to the first configuration example in that, as to the cover CV, the lower surface 31B of the coloring layer 31 located in the lowermost layer is equivalent to the second surface CB of the cover CV and also that, in the second surface CB, the concavity 200 is formed in a position overlapping the convexity 100. In the second configuration example, the concavity 200 is formed by taking advantage of that the third base 30 has variable thickness. More specifically, the third base 30 has a thickness (fifth thickness) T21 in the concavity 200 and a thickness (sixth thickness) T22 around the concavity 200 in the non-display area NDA. The thickness T21 is less than the thickness T22. The coloring layer 31 is formed on the lower surface 30B and has a constant thickness T23 in the non-display area NDA. Thus, the concavity 200 is formed on the lower surface 31B of the coloring layer 31. In the cover CV with such a structure, a total of the thickness T21 and the thickness T23 is equivalent to the thickness T1 shown in FIG. 1, and a total of the thickness T22 and the thickness T23 is equivalent to the thickness T2 shown in FIG. 1.

Figure 8:
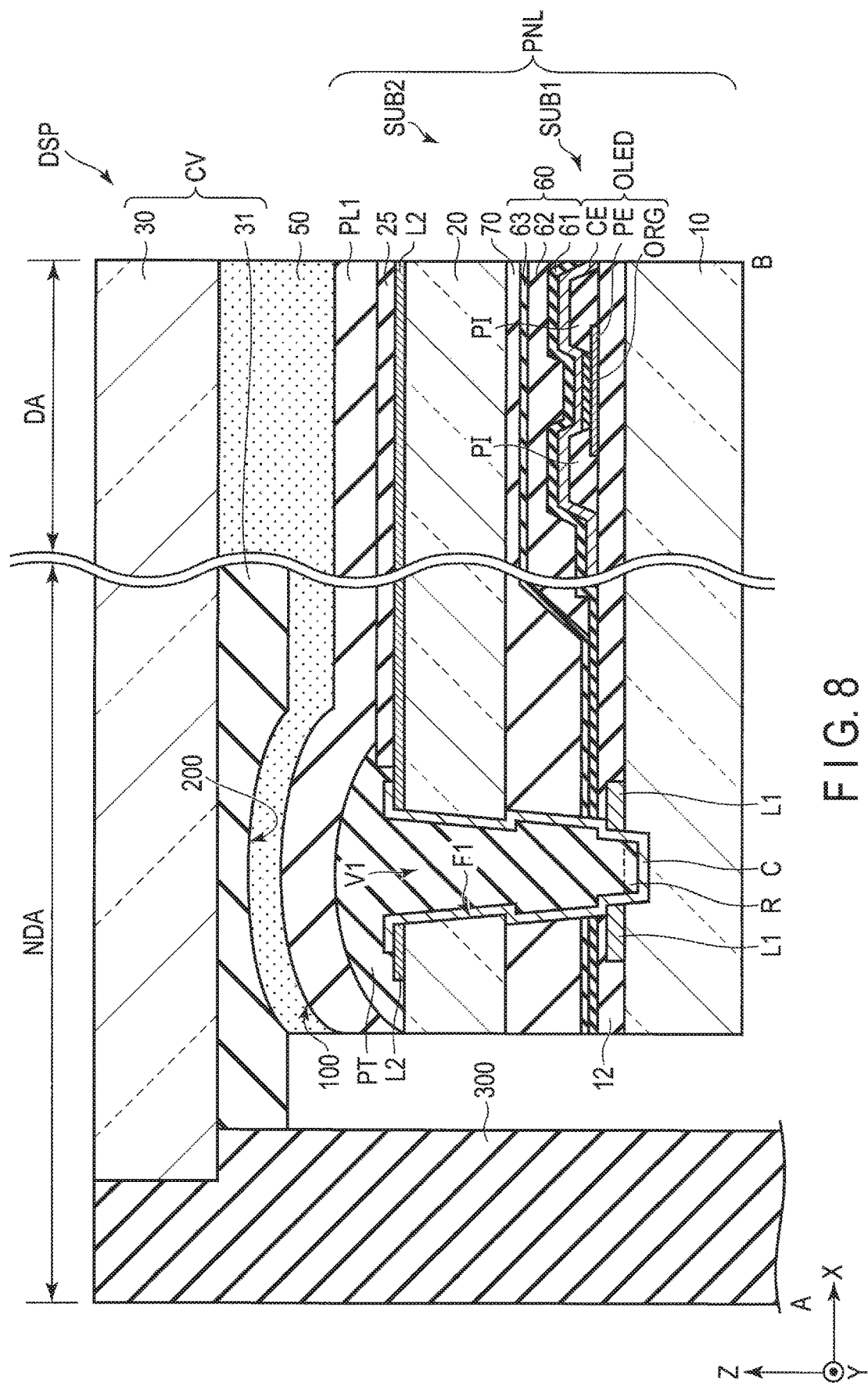
FIG. 8 is a cross-sectional view showing a third configuration example of the display device DSP of the first embodiment.

FIG. 8 is a cross-sectional view showing a third configuration example of the display device DSP of the first embodiment. The third configuration example shown in FIG. 8 is different from the first configuration example shown in FIG. 5 in that the display panel PNL comprises an organic electroluminescence (EL) element OLED. The organic EL device OLED is provided in the first substrate SUB1, and is formed on the second insulating layer 12. The organic EL device OLED is a spontaneous light-emitting element of a top emission type, which emits light toward the second substrate SUB2. The organic EL device OLED comprises a pixel electrode PE formed on the second insulating layer 12, a common electrode CE opposing the pixel electrode PE and an organic emitting layer ORG disposed between the pixel electrode PE and the common electrode CE. Partitions PI are formed on the second insulating layer 12 to form the organic EL device OLED by partitioning. The organic EL device OLED is sealed by a transparent sealing film 60. The sealing film 60 comprises, for example, inorganic insulating layers 61 and 63 and an organic insulating layer 62. The inorganic insulating layer 61 covers the common electrode CE. The organic insulating layer 62 is located between the inorganic insulating layers 61 and 63. The inorganic insulating layer 63 is in contact with the inorganic insulating layer 61 in the non-display area NDA. An adhesive layer 70 is interposed between the sealing film 60 and the second base 20.

The hole V1 penetrates the second base 20 and the adhesive layer 70. Further, the hole V1 is formed in a position where it does not penetrate the organic insulating layer 62. Therefore, the hole V1 penetrates the inorganic insulating layers 61 and 63 of the sealing film 60. In the third configuration example, the concavity 200 is formed by the coloring layer 31 which has different thicknesses as in the first configuration example, but it may be formed by the third base 30 which has different thicknesses as in the second configuration example.

Figure 9:
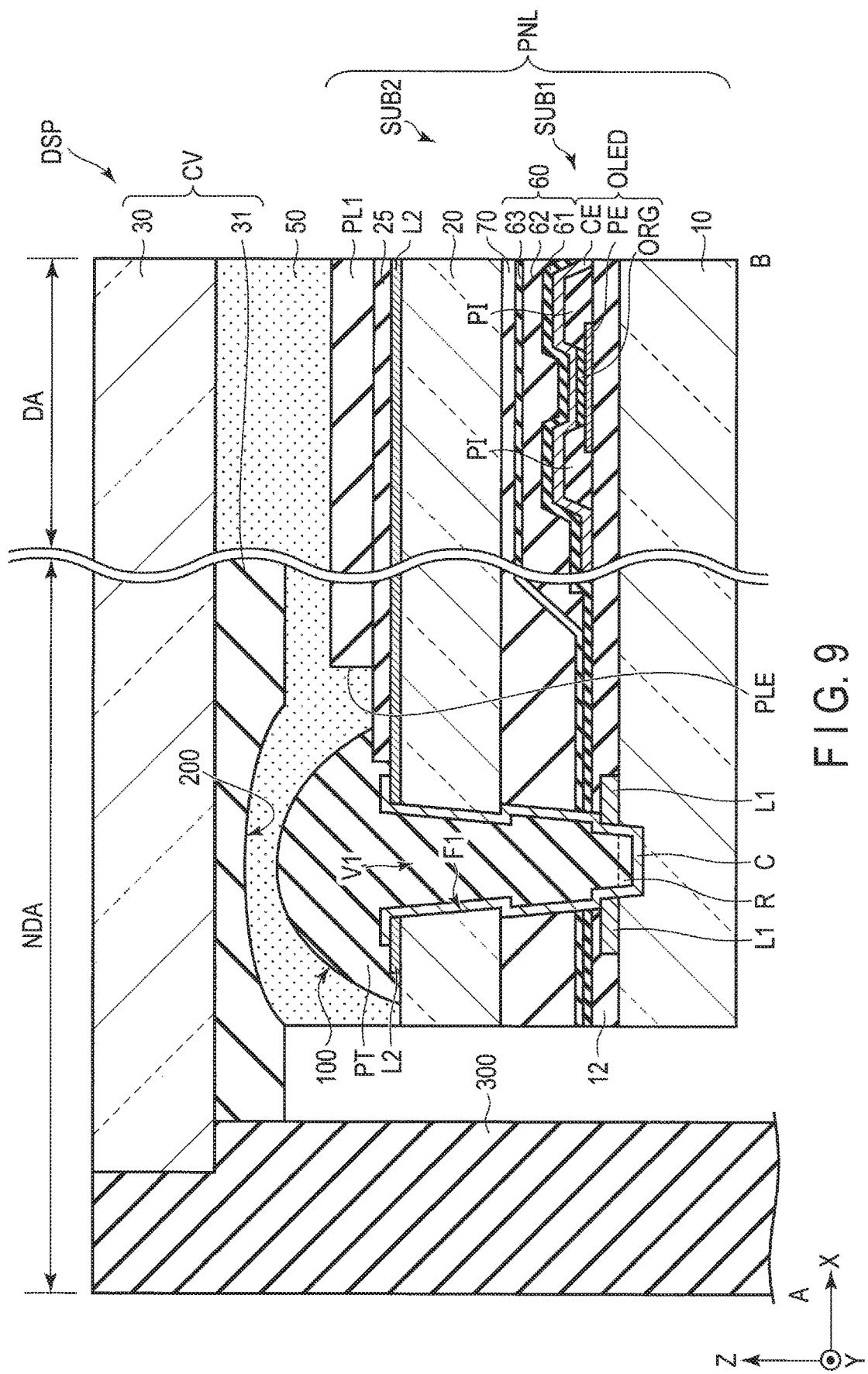
FIG. 9 is a cross-sectional view showing a fourth configuration example of the display device DSP of the first embodiment.

FIG. 9 is a cross-sectional view showing a fourth configuration example of the display device DSP of the first embodiment. The fourth configuration example shown in FIG. 9 is different from the third configuration example shown in FIG. 9 in that the polarizer PL1 comprises an end portion PLE on a side of the proximity to the display area DA with respect to the protective member PT. The protective member PT forms a convexity 100 projecting toward the cover CV. The adhesive layer 50 is in contact with each of the polarizer PL1 and the third base 30 in the display area DA. The adhesive layer 50 is in contact with each of the polarizer PL1, the protective member PT and the coloring layer 31 in the non-display area NDA.

Note that the fourth configuration example described above is an example in which the embodiment is applied to a display panel PNL comprising an organic EL device OLED, but it is also possible to apply, as to a display panel PNL comprising a liquid crystal layer LC such as in the first and second configuration examples, a protective member PT which forms a polarizer PL1 and a convexity 100 described in the fourth configuration example.

According to the first to fourth configuration examples described above, the convexity 100 of the display panel PNL and the concavity 200 of the cover CV are formed to oppose each other in the non-display area NDA. With this structure, as described above, even if air bubbles are generated by the manufacturing process, the cover CV and the display panel PNL can be attached to each other without allowing the air bubbles to remain on a side of the display area DA with respect to the convexity 100, thereby making it possible to suppress degrading of the display quality of the display device.

Next, examples of formation of a concavity and a convexity will be described.

FIG. 10 is a perspective view showing a fifth configuration example of the display device DSP of the first embodiment. The display panel PNL comprises a plurality of holes V (V1, V2, . . . ) and a plurality of protective members PT (PT1, PT2, . . . ). The protective members PT and the holes V are all located in the non-display area NDA. For example, as described above with reference to FIG. 3, the odd-numbered holes V1, V3, . . . are located in one end portion NDA1 and are arranged along the second direction Y at intervals. The even-numbered holes V2, V4, . . . are located in the other end portion NDA2 and are arranged along the second direction Y at intervals. The hole V1 is filled with the protective member PT1, and the hole V2 is filled with the protective member PT2. Thus, each of the holes V is filled with each respective one of the protective members PT, and thus one protective member PT is not filled into a plurality of holes V. Each of the protective members PT is covered by the polarizer PL1. The first surface PA comprises a plurality of convexities 100 (100A, 100B, . . . ). For example, the convexity 100A is formed in a position overlapping the protective member PT1 and the convexity 100B is formed in a position overlapping the protective member PT2. Thus, each of the convexities 100 is formed in each respective position overlapping a respective one of the protective members PT or the holes V. Thus, the convexities 100A, 100C, 100E, . . . are located in one end portion NDA1 and are arranged along the second direction Y at intervals. Further, the convexities 100B, 100D, 100F, . . . are located in the other end portion NDA2 and are arranged along the second direction Y at intervals. Note that as in the case of the fourth configuration example shown in FIG. 9, the polarizer PL1 may comprise an end portion on a side closer to the display area DA with respect to the protective member PT, and a plurality of protective members PT may form the convexities 100 projecting toward the cover CV, respectively.

The second surface CB of the cover CV comprises a plurality of concavities 200 (200A, 200B, . . . ). Each concavity 200 may be formed, for example, by taking advantage of that the coloring layer 31 has different thicknesses as in the first configuration example shown in FIG. 5, or formed by taking advantage of that the third base 30 has different thicknesses as in the second configuration example shown in FIG. 7. The concavities 200A, 200C, 200E, . . . are arranged along the second direction Y at intervals. Moreover, the concavities 200B, 200D, 200F, . . . are arranged along the second direction Y at intervals. The concavity 200A overlaps the convexity 100A, and the concavity 200B overlaps the convexity 100B. Thus, each of the concavities 200 overlaps each respective one of the convexities 100.

Figure 11:
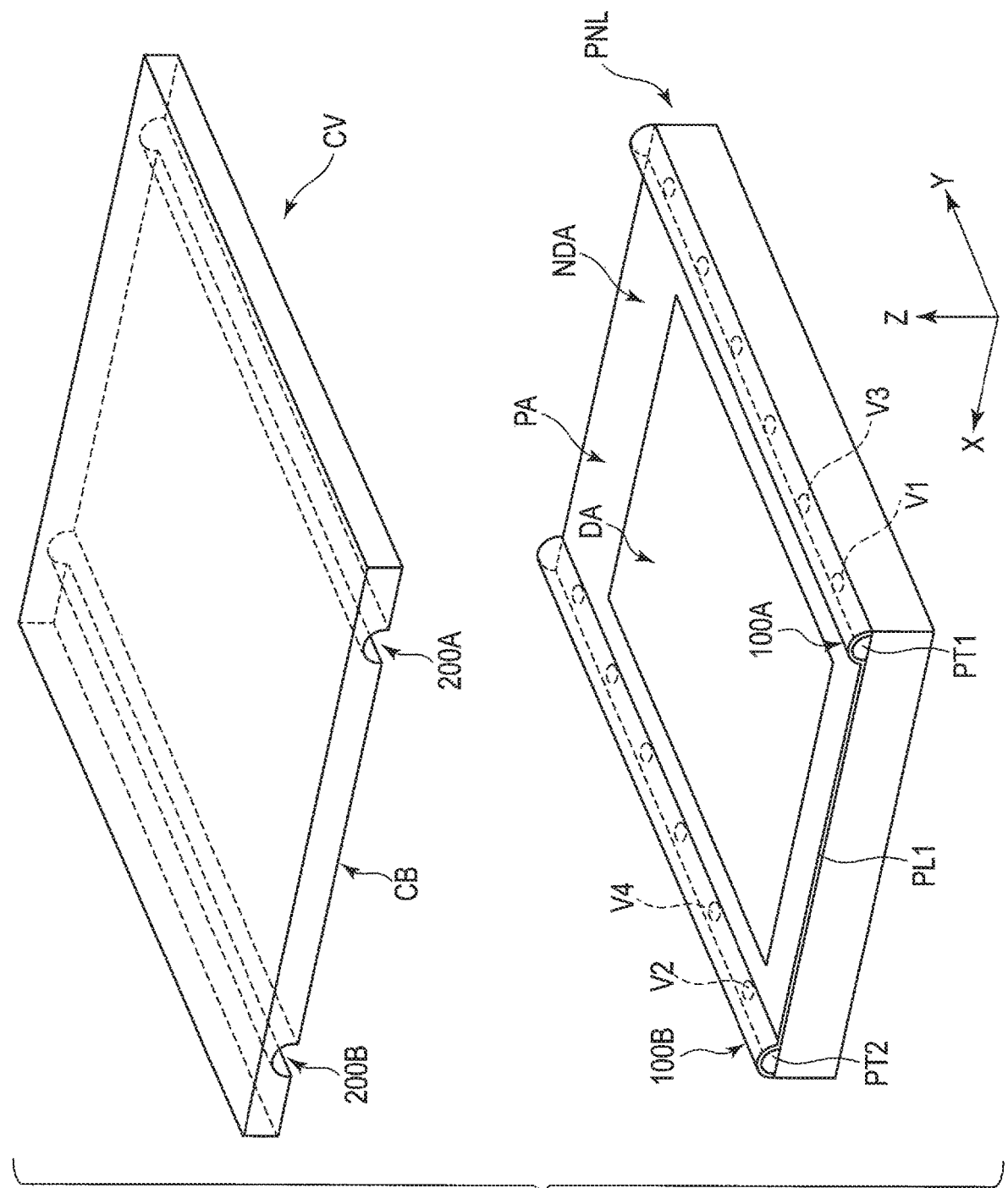
FIG. 11 is a cross-sectional view showing a sixth configuration example of the display device DSP of the first embodiment.

FIG. 11 is a perspective view showing a sixth configuration example of the display device DSP of the first embodiment. The sixth configuration example is different from the fifth configuration example shown in FIG. 10 in that one protective member PT is disposed over two or more holes V, and that the concavities 200 are formed into a belt-like shape extending along the second direction Y. In the example illustrated, the protective member PT1 is filled into all the odd-numbered holes V, whereas the protective member PT2 is filled into all the even-numbered holes V. Further, the protective members PT1 and the protective members PT2 are each formed to extend along the second direction Y. Note that the protective member PT1 may not necessarily be formed continuously all the way in each of the odd-numbered holes, but may be interrupted in its middle. Similarly, the protective member PT2 may be interrupted in the middle. The protective members PT1 and the protective members PT2 are covered by the polarizer PL1. The first surface PA comprises a convexity 100A in a position overlapping the protective member PT1, and comprises a convexity 100B in a position overlapping the protective member PT2. The convexity 100A extends along the second direction Yin which the odd-numbered holes V are arranged. The convexity 100B extends along the second direction Yin which the even-numbered holes V are arranged. Note that as in the case of the fourth configuration example shown in FIG. 9, the polarizer PL1 may comprise an end portion on the side closer to the display area DA with respect to the protective members PT1 and PT2, and the protective members PT1 and PT2 may respectively form the convexities 100A and 100B projecting toward the cover CV.

The second surface CB of the cover CV comprises the concavity 200A and the concavity 200B. The concavity 200A overlaps the convexity 100A, and the concavity 200B overlaps the convexity 100B. The concavity 200A is formed to extend along the extending direction of the convexity 100A. The concavity 200B is formed to extend along the extending direction of the convexity 100B. As described above, the six configuration example is similar to the fifth configuration example in the respect that one concavity 200 overlaps one convexity 100, but it is different from the fifth configuration example in that one convexity and one concavity each overlap two or more holes V.

Figure 12:
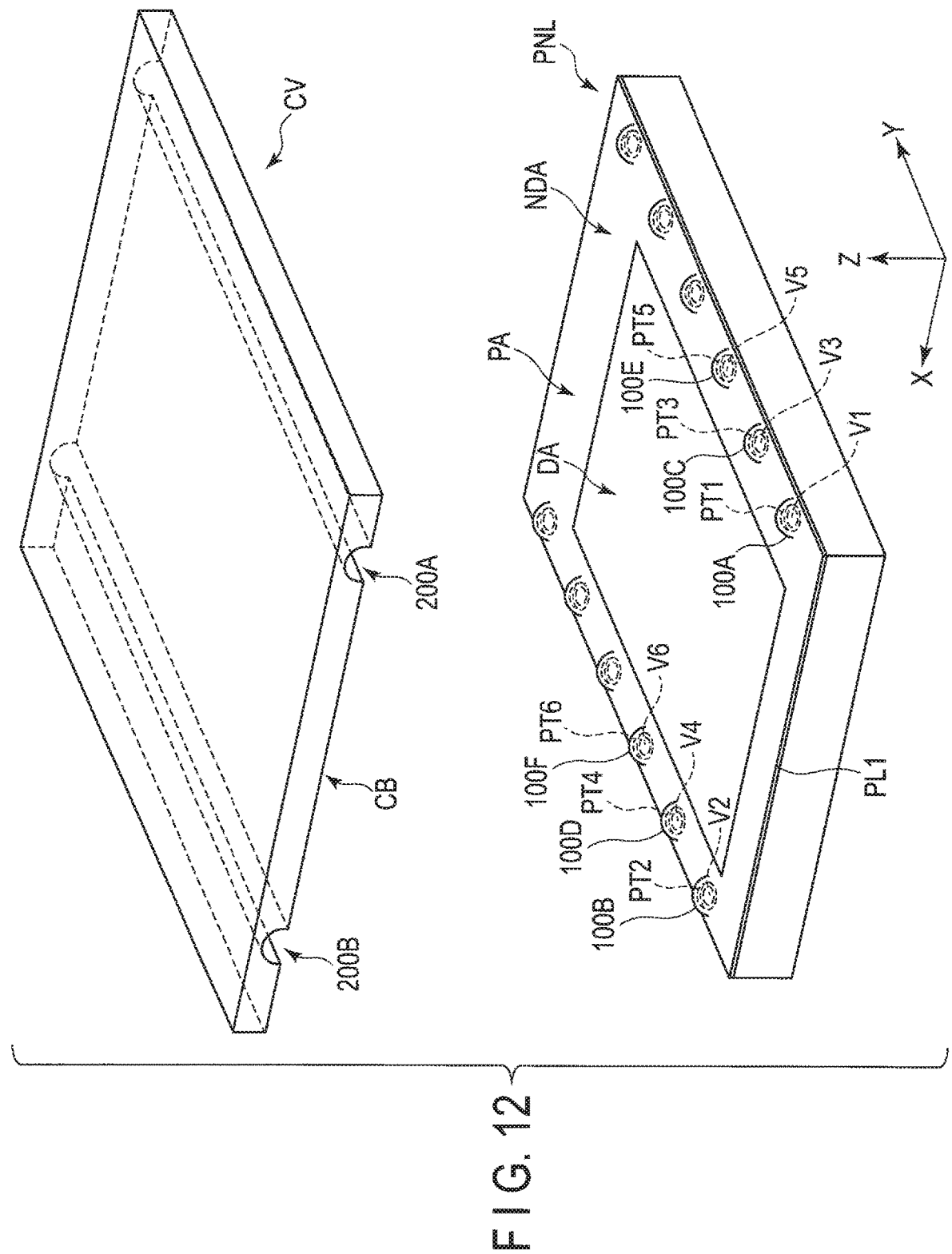
FIG. 12 is a cross-sectional view showing a seventh configuration example of the display device DSP of the first embodiment.

FIG. 12 is a perspective view showing a seventh configuration example of the display device DSP of the first embodiment. The seventh configuration example is equivalent to a combination of the display panel PNL described in the fifth configuration example and the cover CV described in the sixth configuration example. More specifically, the concavity 200A overlaps the convexity 100A, the convexity 100C and the convexity 100E, and the concavity 200B overlaps the convexity 100B, the convexity 100D and the convexity 100F.

(Second Embodiment)

Next, the second embodiment will be described.

Figure 13:
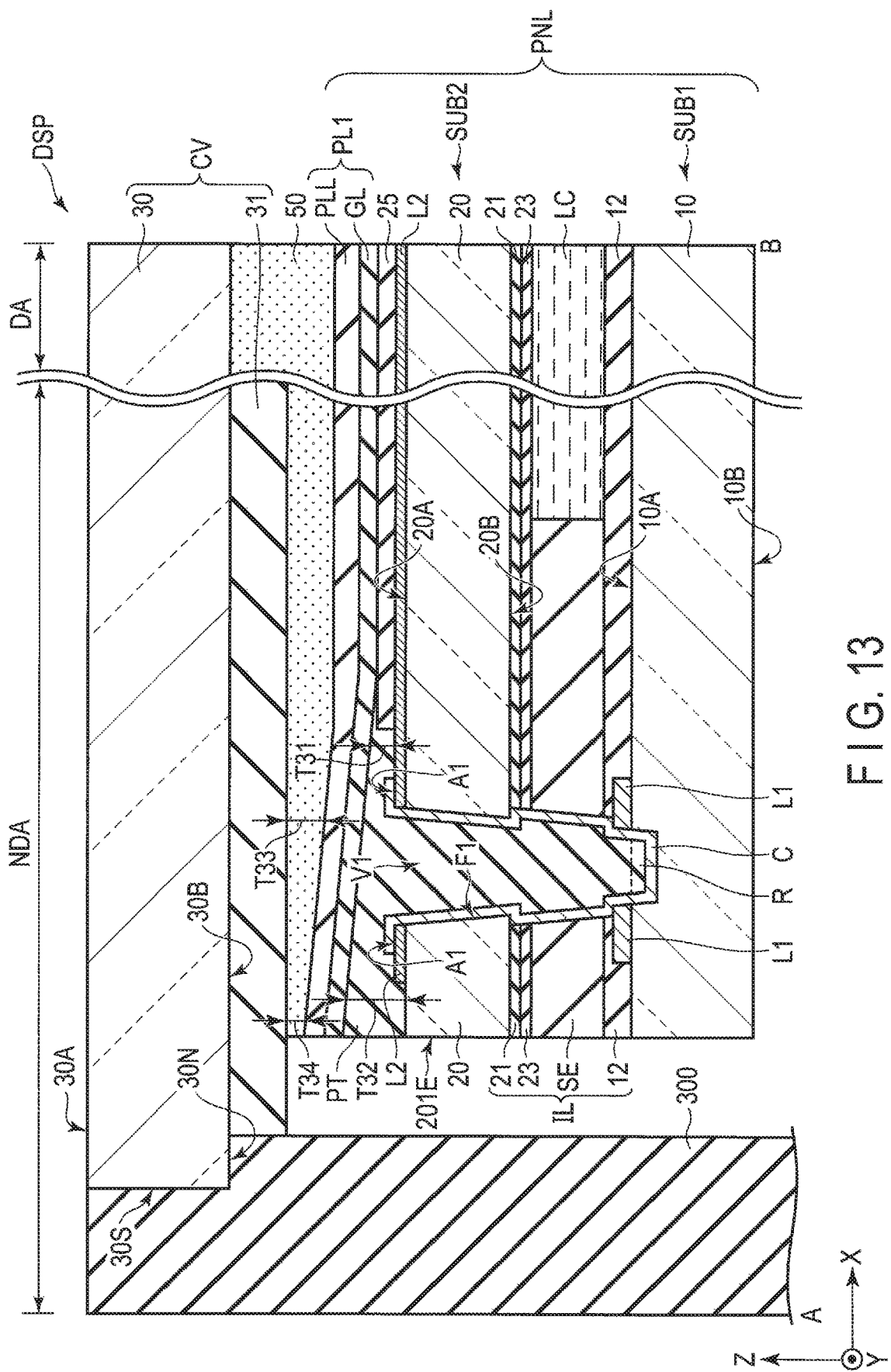
FIG. 13 is a cross-sectional view showing a first configuration example of a display device of a second embodiment.

FIG. 13 is a cross-sectional view showing a first configuration example of a display device DSP of the second embodiment. The first configuration example of the second embodiment shown in FIG. 13 is different from of the first configuration example of the first embodiment shown in FIG. 5 mainly in the shape of the protective member PT.

The protective member PT has a first thickness T31 on a side of the display area DA with respect to the hole V1 and a second thickness T32 on a side of an end portion 201E of the second base 20 with respect to the hole V1. The first thickness T31 is less than the second thickness T32 (T31<T32). The protective member PT is formed so as to increase its thickness in the X-Z plane, gradually from the side of the display area DA with respect to the hole V1 as the starting point, towards the end portion 201E side. With this structure, it is possible to suppress an increase in the level difference between the protective member PT and the overcoat layer 25 especially on the display area DA side of the protective member PT, and thus inhibit the forming of air bubbles under the polarizer PL1.

Note that the first thickness T31 should preferably the same as or substantially equivalent to the thickness of the overcoat layer 25. Moreover, as shown in FIG. 13, a part of the protective member PT which has the first thickness T31 may be formed to cover the end portion of the overcoat layer 25.

In order to inhibit the connecting material C from being visible through the protective member PT, the thickness of the protective member PT is 4 μm or more in the region which overlaps the connecting material C. The thickness of the protective member PT is about 10 μm in the position which overlaps the end portion 201E, and is about 1 to 2 μm in its thinnest part. Note that the detection electrode (the second conductive layer L2) is black, the protective member PT formed on the detection electrode film may have such a thickness that the detection electrode can be seen through.

The polarizer PL1 comprises a polarizing layer PLL and an adhesive layer GL, and the adhesive layer GL is in contact with the protective member PT and the overcoat layer 25. The adhesive layer GL has a thickness of about 10 μm. With this structure, the protective member PT covers the end portion of the overcoat layer 25, and even if there is a slight level difference between the protective member PT and the overcoat layer 25, such a level difference is absorbed by the adhesive layer GL. The polarizer PL1 is disposed substantially parallel to the X-Y plane in the position which overlaps the overcoat layer 25. Further, the polarizer PL1 inclines along the shape of the protective member PT in the position which overlaps the protective member PT. That is, the polarizer PL1 projects most to the cover CV side in the position which overlaps the end portion 201E.

FIG. 14 is a plan view illustrating the surrounding of the hole V1 shown in FIG. 13. The protective member PT extends to the end portion 201E of the second base 20. The protective member PT comprises a curved portion RN, which defines an outline on the display area DA side in plan view. In the curved portion RN, the thickness of the protective member PT is 1 to 2 μm, for example. Thus, the level difference between the protective member PT and the overcoat layer 25 can be decreased over the curved portion RN, and therefore the protective member PT can be attached onto the polarizer PL1 to follow its configuration as shown in FIG. 13. As a result, air bubbles which may be created between the polarizer PL1 and the protective member PT or the overcoat layer 25 while attaching the polarizer PL1 move towards the end portion 201E of the second base 20 along the edge portion of the protective member PT. Therefore, it is possible to suppress air bubbles from remaining on the display area DA side with respect to the protective member PT.

Moreover, since the polarizer PL1 is adhered onto the protective member PT while following the protective member PT, there is no space where air bubbles may be created on the end portion 201E side in the protective member PT, and air bubbles are expelled to the outside of the substrate. Or, even if air bubbles remain around the end portion 201E, they can be suppressed to a small amount. In the example illustrated, air bubbles Bu are created in a corner portion where the end portion 201E and the protective member PT intersect. Here, into consideration of the mobility of air bubbles while attaching the polarizer PL1, a cross sectional shape of the protective member PT, parallel to the first direction X should preferably be of such a structure that the thickness increases towards the end portion 201E at any position as shown in FIG. 13. Note that in the portion corresponding to the curved portion RN, such a structure may as well be adoptable that it is, for example, inclined downwards in the direction which is radial from the center of the hole towards the curved portion RN. Such a downward inclination may be formed linearly or curvy in a convex shape.

The adhesive layer 50 has a third thickness T33 on the display area DA side with respect to a position which overlaps the hole V1, and a fourth thickness T34 on the end portion 201E side with respect to the position which overlaps the hole V1. The third thickness T33 is greater than the fourth thickness T34. In other words, the thickness of the adhesive layer 50 decreases towards the end portion 201E side due to the shape of the protective member PT.

According to the second embodiment, the protective member PT increases its thickness towards the end portion 201E of the second base 20, and comprises the curved portion RN on the display area DA side in plan view. With this structure, even if air bubbles are generated around the hole V1 while attaching the polarizer PL1, the air bubbles Bu can be located in the end portion 201E side, which is most distant from the display area DA.

Figure 15:
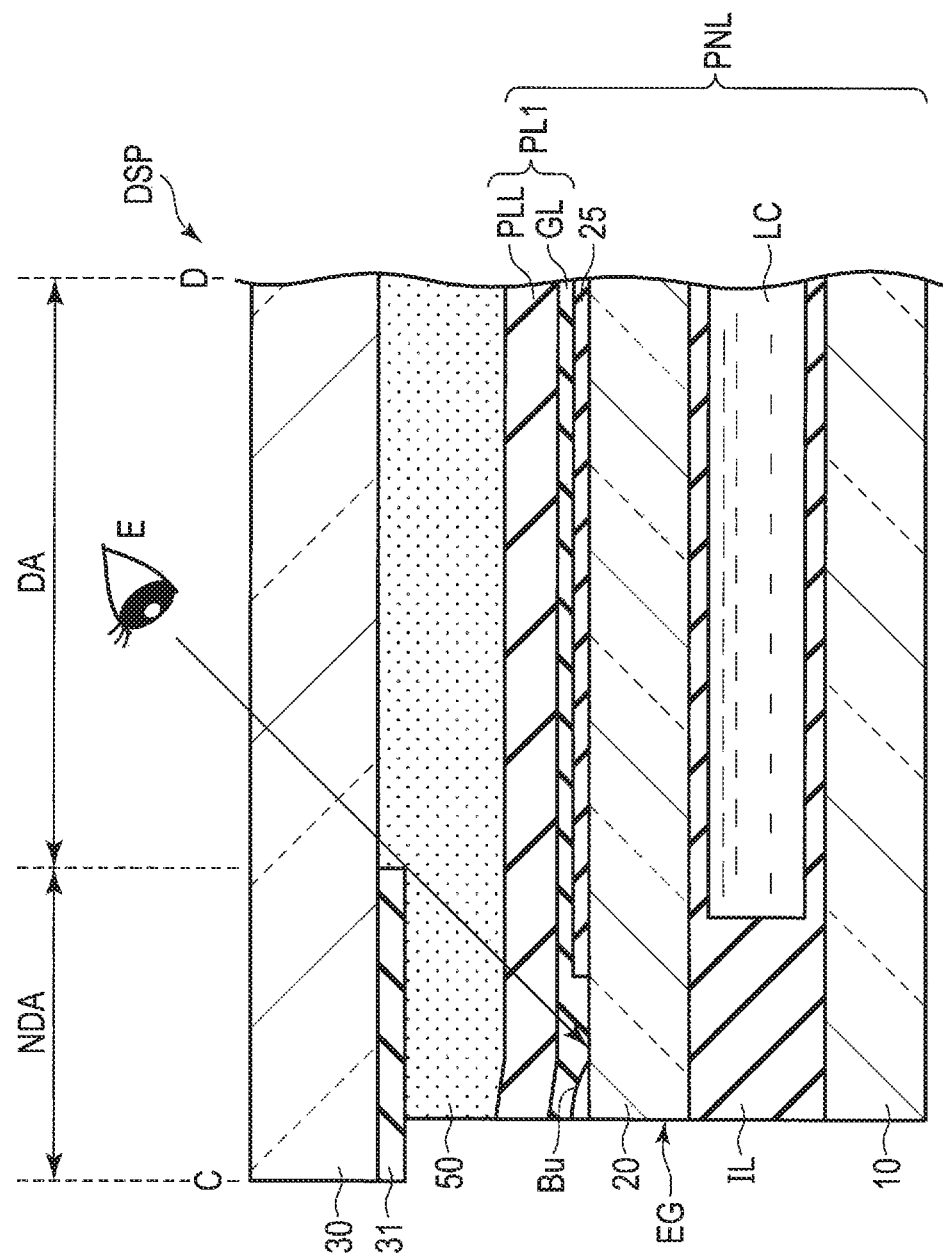
FIG. 15 is a cross-sectional view of the display panel taken along line C-D shown in FIG. 14.

FIG. 15 is a cross-sectional view of the display panel DSP taken along line C-D shown in FIG. 14. Since air bubbles Bu are created in a position which overlaps the coloring layer 31, they cannot be seen from right above the display device DSP. Moreover, the air bubbles Bu do not remain on the substrate, or if they remain, they remain only in a position comparatively distant from the display area DA. Therefore, they cannot be visually recognized by an observer E even when observing the display device DSP obliquely.

Or such air bubbles as described above can be extracted from the outer end portion side of the protective member PT to the outside of the substrate by the structure of this embodiment.

Thus, according to the second embodiment, it is possible to inhibit the air bubbles Bu from being visually recognized if the display device DSP is viewed from an oblique direction, and thus degradation of the display quality of the display device DSP can be suppressed.

Next, an example of the method of manufacturing the above-described display device DSP will be described with reference to FIGS. 16 to 18.

Figure 17:
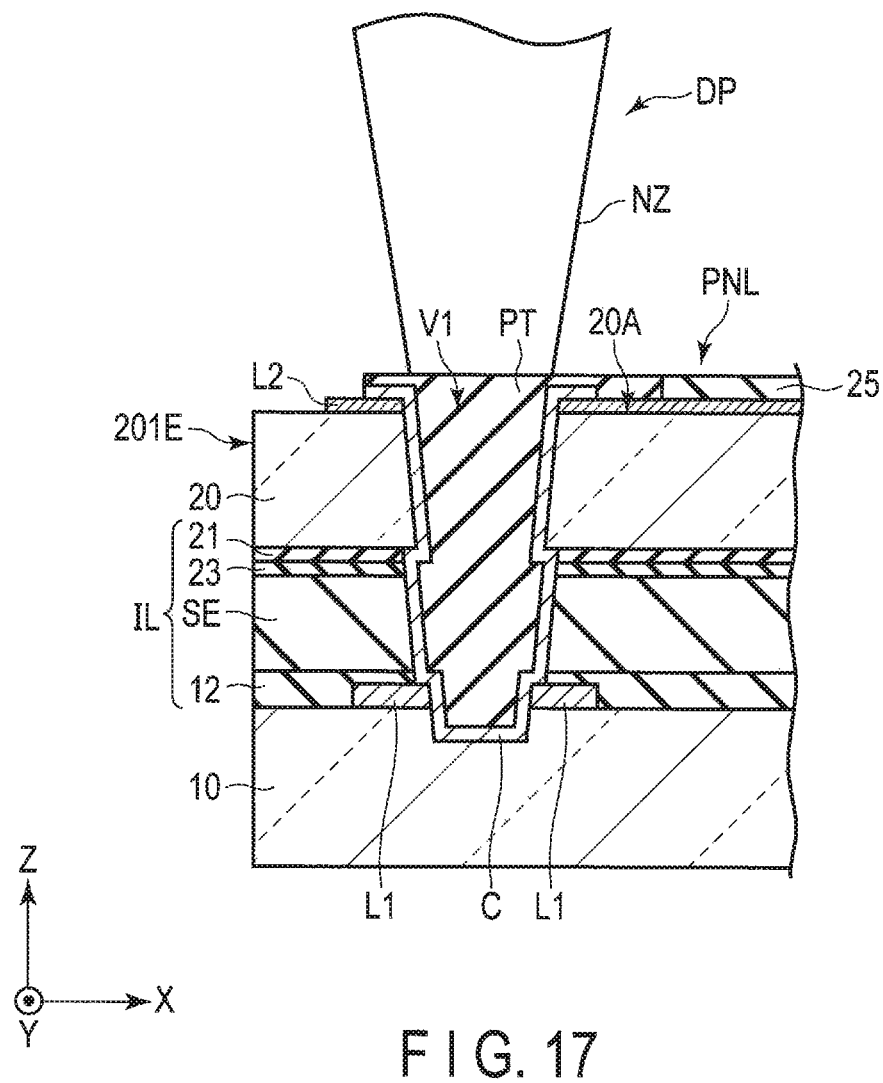
FIG. 17 is a diagram illustrating another step in a method of manufacturing the display device of the second embodiment.
Figure 18:
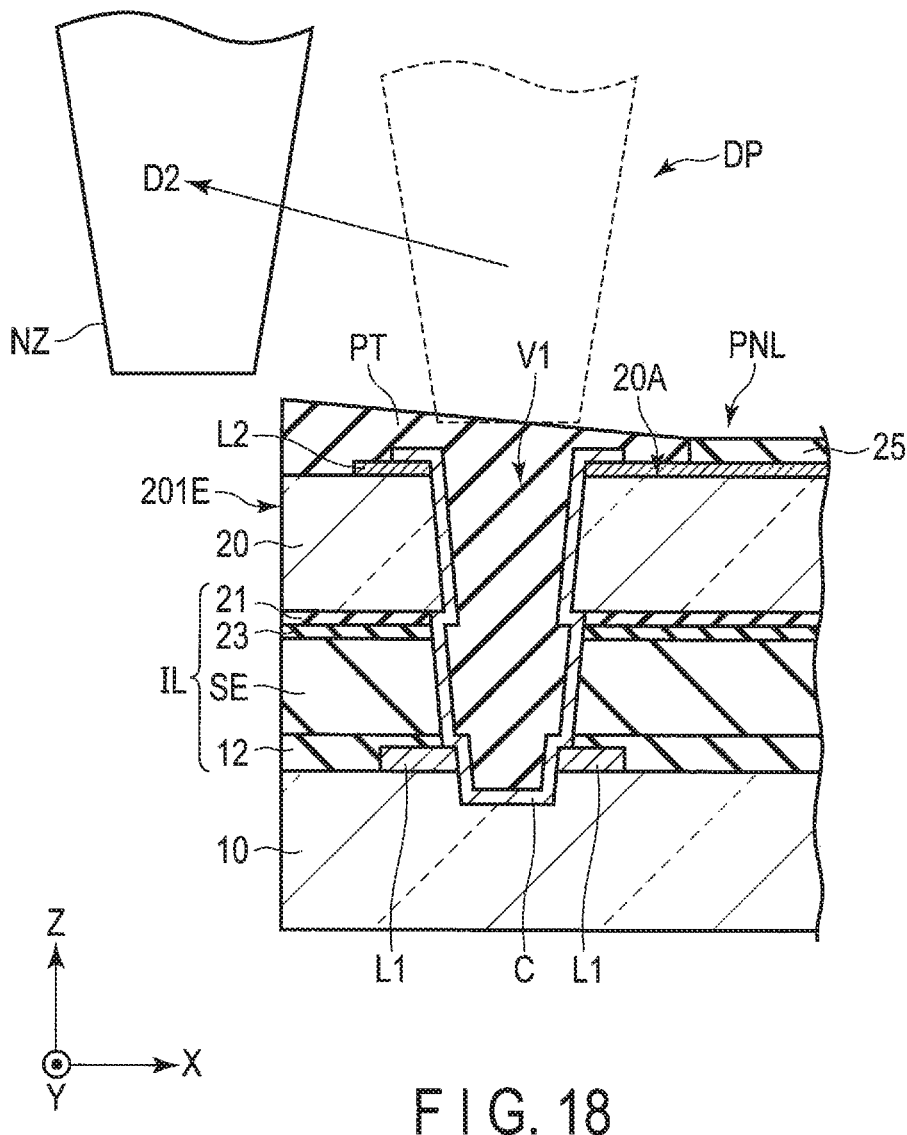
FIG. 18 is a diagram illustrating another step in a method of manufacturing the display device of the second embodiment.

FIGS. 16 to 18 are diagrams each showing a step in the method of manufacturing the display device DSP of the second embodiment. FIGS. 16 to 18 each shows a cross section of the display panel PNL taken along line A-B, which includes the hole V1 shown in FIG. 3. Here, only the main parts necessary for the explanation are illustrated. FIG. 16 shows a step following the formation of the connecting material C.

As shown in FIG. 16, a display panel PNL is prepared. In the display panel PNL illustrated, the first base 10, the second base 20, the insulating layer IL, the first conductive layer L1, the second conductive layer L2, the connecting material C and the overcoat layer 25 are formed. First, as shown in FIG. 16, a nozzle NZ of a dispenser DP is descended towards the hole V1. In the example illustrated, the nozzle NZ is descended along a direction D1 perpendicular to the main surface 20B. Here, the direction D1 is a direction parallel to the third direction Z. The nozzle NZ opposes the hole V1 along the third direction Z.

Next, as shown in FIG. 17, the protective member PT is dispersed from the nozzle NZ to fill the hole V1 with the protective member PT.

Next, as shown in FIG. 18, the nozzle NZ is slid to the end portion 201E of the second base 20 from the hole V1 while holding the dispensing of the protective member PT from the nozzle NZ. As the nozzle NZ is being slid, the nozzle NZ is pulled upwards to be spaced away from the second base 20. Thus, the protective member PT is formed thin on the display unit side, whereas thick on the end portion 201E side, and thus the upper surface of the protective member PT inclines. In the example illustrated, the nozzle NZ is moved along a direction D2 inclined to the upper surface 20A. Here, the direction D2 is a direction in which the first direction X and the third direction Z are combined.

Figure 19:
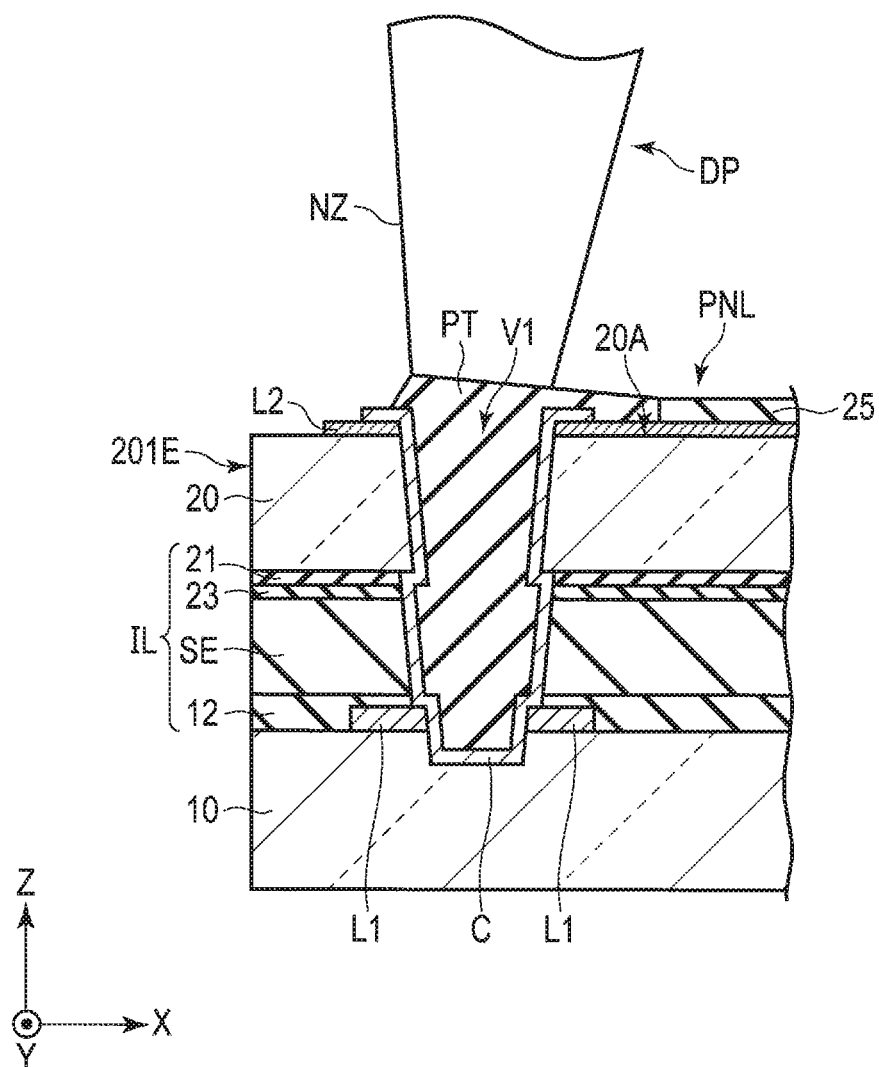
FIG. 19 is a diagram showing a modified example of the method of manufacturing the display device of the second embodiment.
Figure 20:
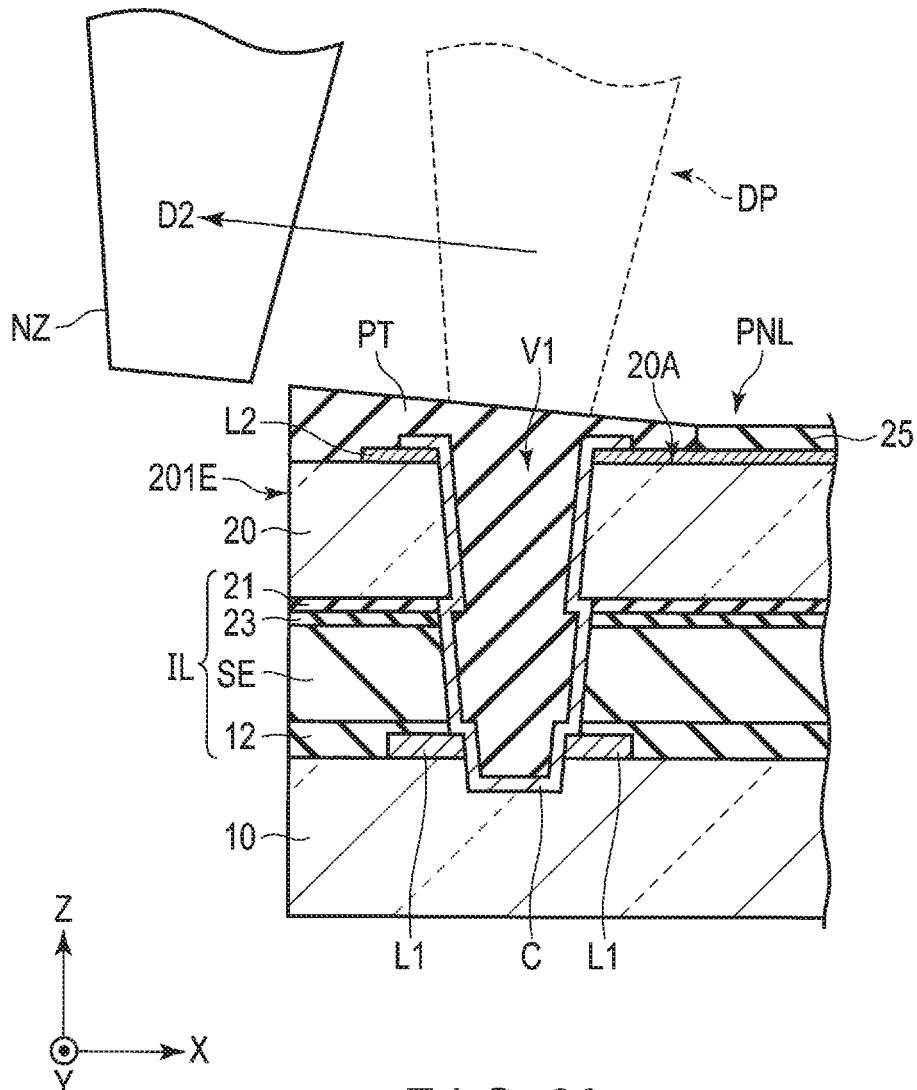
FIG. 20 is a diagram showing another modified example of the method of manufacturing the display device of the second embodiment.

FIGS. 19 and 20 are diagrams each showing a modified example of the method of manufacturing the display device DSP of the second embodiment.

The structure shown in FIG. 19 is different from the structure shown in FIG. 17 in that the nozzle NZ inclines. That is, after filling the hole V1 with the protective member PT, the nozzle NZ inclines. In the example illustrated, the nozzle NZ inclines in a direction parallel to the X-Z plane so that a distal end faces the end portion 201E side.

The structure shown in FIG. 20 is different from that of FIG. 18 in that the nozzle NZ inclines. Thus, the nozzle NZ is moved in the direction D2 while the nozzle NZ are inclined, the protective member PT may be formed.

Figure 21:
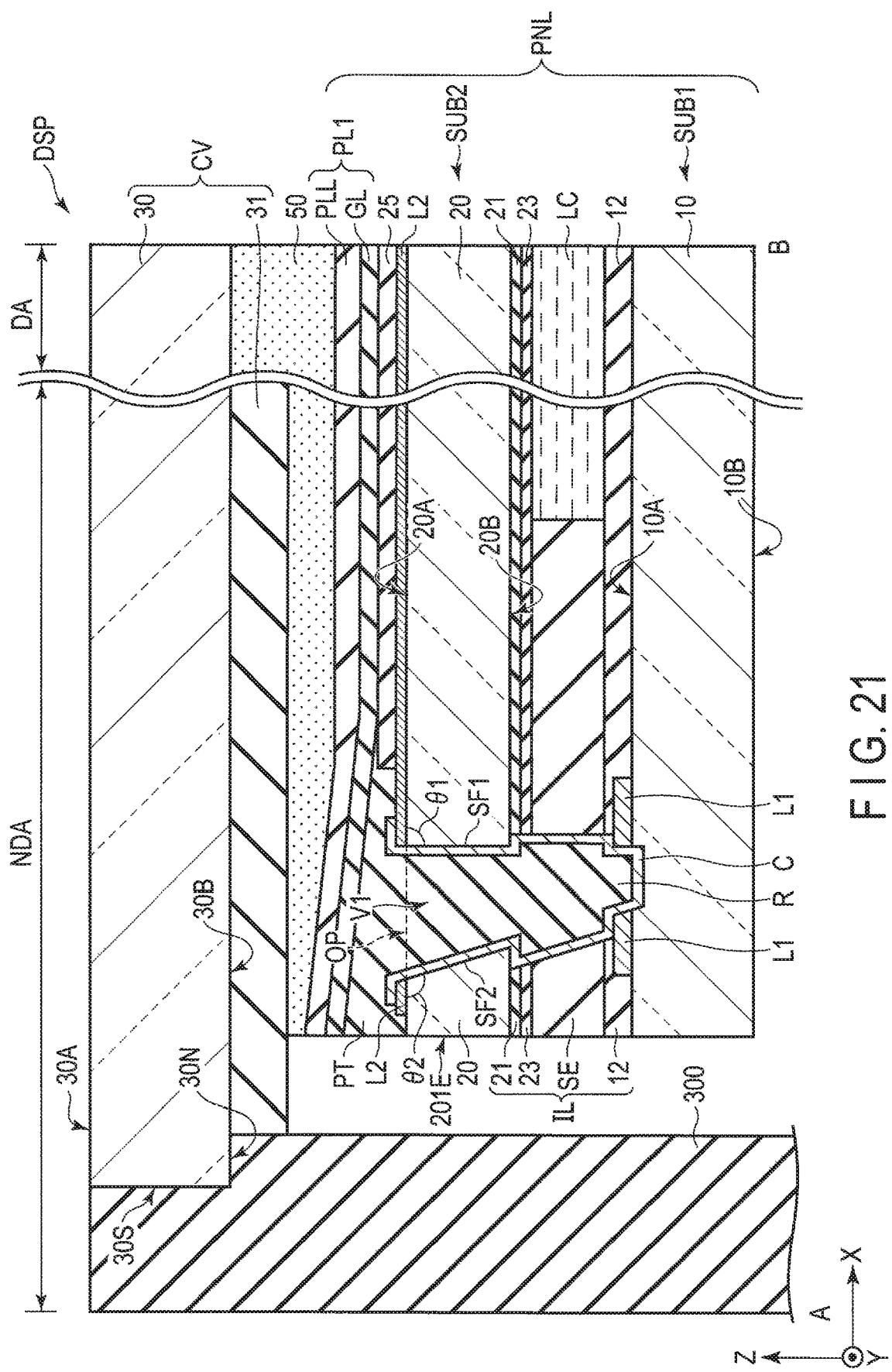
FIG. 21 is a cross-sectional view showing a second configuration example of the display device of the second embodiment.

FIG. 21 is a cross-sectional view showing a second configuration example of the display device DSP of the second embodiment. The structure shown in FIG. 21 is different from that of FIG. 13 in that the hole V1 inclines in the end portion 201E side.

The hole V1 comprises, in the second base 20, a first side portion SF1 on the display area DA side and a second side portion SF2 on the end portion 201E side. Here, the hole V1 is formed to be cylindrical hollow in the second base 20, and the first side portion SF1 and the second side portion SF2 are equivalent to the portions illustrated linearly in the cross section of FIG. 21. In the second base 20, a first angle $\theta1$ is made between the first surface portion SF1 and the upper surface 20A of the second base 20, and a second angle $\theta1$ is made between the second side portion SF2 and the upper surface 20A. The first angle $\theta1$ is less than the second angle $\theta2$. In the second embodiment, the first angle $\theta1$ should preferably be 90° or higher so as to adhere the connecting material C to the first surface portion SF1 side. In the example illustrated, it is about 90°. Moreover, since the second side portion SF2 gently inclines, the connecting material C easily adheres to the second side portion SF2 side.

The hole V1 with such a configuration is formed by applying a laser beam inclined to the normal of the upper surface 20A. With the hole V1 being inclined, the opening OP of the hole V1 is formed on an end portion 201E side as compared to that of the example shown in FIG. 13.

Similarly, the protective member PT is disposed on the end portion 201E side. Therefore, when the display device DSP is viewed from an oblique direction, is becomes difficult to visually recognize the connecting material C and air bubbles.

Figure 22:
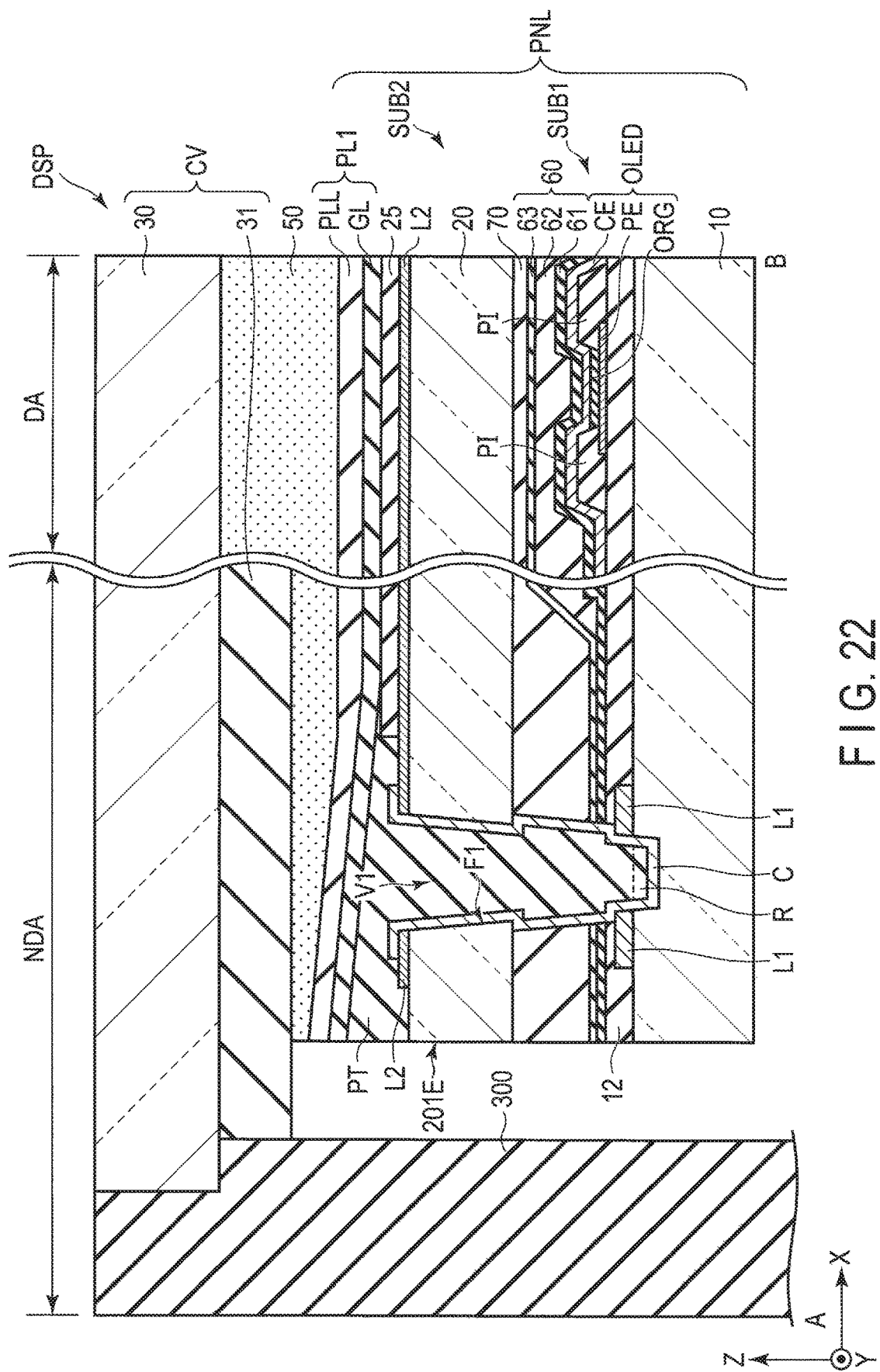
FIG. 22 is a cross-sectional view showing a third configuration example of the display device of the second embodiment.

FIG. 22 is a cross-sectional view showing a third configuration example of the a display device DSP of the second embodiment. The structure shown in FIG. 22 is different from that of FIG. 13 in that the display panel PNL comprises an organic electroluminescence (EL) element OLED. The structure of the display area DA shown in FIG. 22 is similar to that of the display area DA shown in FIG. 8, and therefore its explanation will be omitted. Thus, an organic electroluminescence element OLED is applicable also to the display area DA of the second embodiment.

(Third Embodiment)

Next, the third embodiment will be described.

Figure 23:
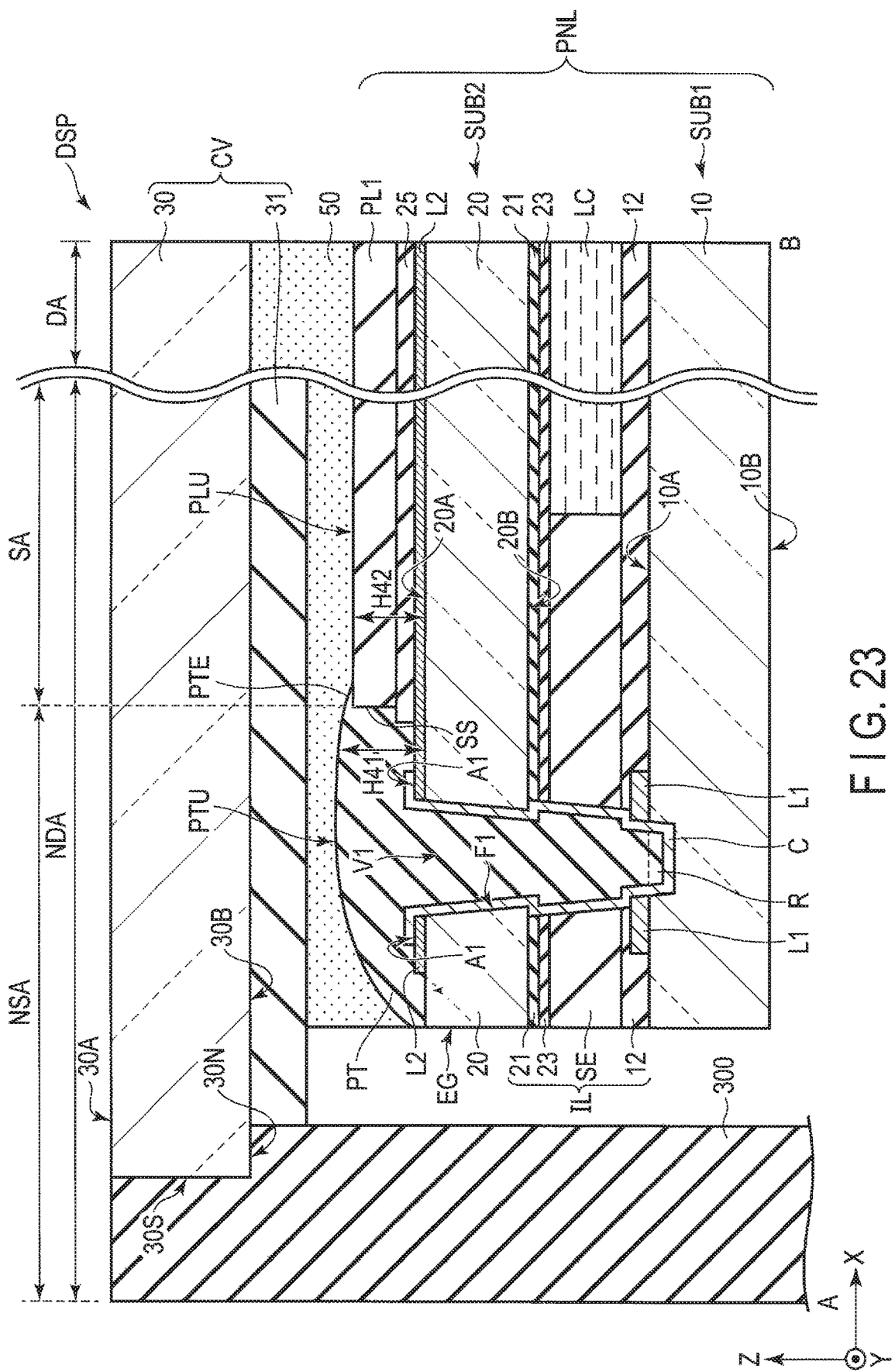
FIG. 23 is a cross-sectional view showing a first configuration example of a display device of a third embodiment.

FIG. 23 is a cross-sectional view showing a first configuration example of a display device DSP of the third embodiment.

In the third embodiment, the polarizer PL1 does not extend to a position which overlaps the hole V1. With this structure, the protective member PT is located adjacent to the polarizer PL1 in the first direction X, and is in contact with the end PLE portion of the polarizer PL1. Further, the end portion PTE of the protective member PT is located on the display area DA and is formed to overlap on the polarizer PL1. Naturally, such a structure can be adopted as well that the end portion PTE does not overlap the polarizer PL1.

In the third embodiment, a height H41 from the upper surface 20A of the second base 20 to the upper surface PTU of the protective member PT is equal to or greater than a height H42 from the upper surface 20A to the upper surface PLU of the polarizer PL1. Moreover, the non-display area NDA comprises a superimposing area SA superimposed on the polarizer PL1 and a non-superimposing area NSA not superimposed on the polarizer PL1. The hole V1 and the protective member PT are formed in the non-superimposing area NSA. The adhesive layer 50 is in contact with the upper surface PTU of the protective member PT and the upper surface PLA of the polarizer PL1.

FIG. 24 is a plan view showing the shape of the polarizer PL1 shown in FIG. 23.

In the example illustrated, a width W1 of the polarizer PL1 along the first direction X is less than a width W2 of the second base 20 of the first direction X. The polarizer PL1 comprises end portions PLE1 and PLE2 extending along the second direction Y. The end portion PLE1 overlaps one end portion NDA1, and it is located on the display area DA side with respect to the holes V1 and V3. The end portion PLE2 overlaps one end portion NDA2, and it is located on the display area DA side with respect to the holes V2 and V4. The protective members PT1 and PT3 are disposed in a region of the one end portion NDA1, where the polarizer PL1 is not provided. The protective members PT2 and PT4 are disposed in a region of the other end portion NDA2, where the polarizer PL1 is not provided.

According to this embodiment, the polarizer PL1 does not overlap on the protective member PT, and the upper surface PTU of the protective member PT is in contact with the adhesive layer 50. With this structure, air bubbles which may be created between the protective member PT and the polarizer PL1 due to the level difference of the protective member PT can be suppressed. Moreover, the polarizer PL1 can be inhibited from being formed into a convex configuration along the shape of the protective member PT, and therefore creation of air bubbles between the polarizer PL1 and the adhesive layer 50 can be suppressed. Thus, it is possible to inhibit air bubbles from becoming visible when the display area DA is viewed from a direction oblique to the third direction Z, and degradation of the display quality can be suppressed.

Next, an example of the method of manufacturing the above-described display device DSP will be described with reference to FIGS. 25 to 28.

Figure 25:
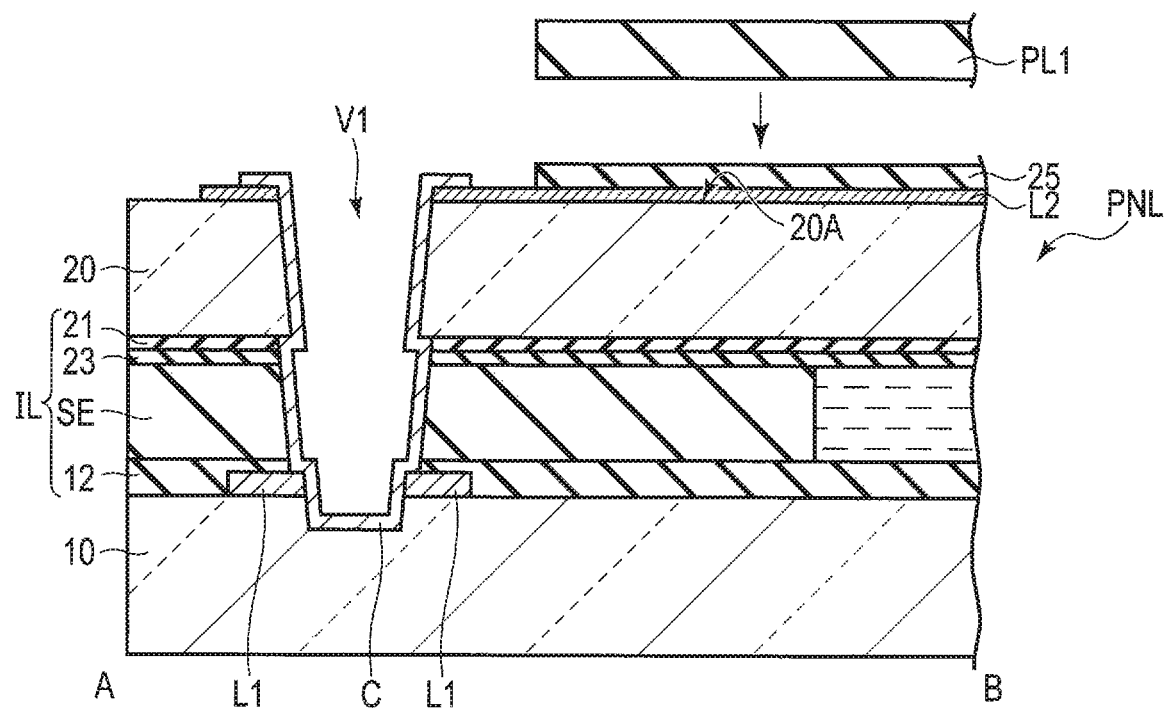
FIG. 25 is a diagram illustrating a step in a method of manufacturing the display device of the third embodiment.

FIGS. 25 to 28 are diagrams each showing a step in the method of manufacturing the display device DSP of the third embodiment. FIGS. 25 to 28 each shows a cross section of the display panel PNL taken along line A-B, which includes the hole V1 shown in FIG. 1. Note that only the main portions necessary for explanation are illustrated here. FIG. 25 shows a step following the formation of the connecting material C.

As shown in FIG. 25, the display panel PNL is prepared. In the display panel PNL illustrated, the first base 10, the second base 20, the insulating layer IL, the first conductive layer L1, the second conductive layer L2, the connecting material C and the overcoat layer 25 are formed. Then, the polarizer PL1 is attached onto the second base 20. The polarizer PL1 is adhered with, for example, an acryl-based adhesive. A margin of the position where the polarizer PL1 is to be attached is, for example, 0.05 mm. The polarizer PL1 may be attached by pressing it from an end portion thereof with a roller, or by adhering the entire surface thereof at the same time by aligning the polarizer PL1 after attaching a transfer sheet onto an entire surface of the polarizer PL1. After attaching the polarizer PL1, the display panel PNL is placed in a pressure device and is pressurized, and thus the air contained in the adhesives of the polarizer PL1 is finely dispersed.

Figure 26:
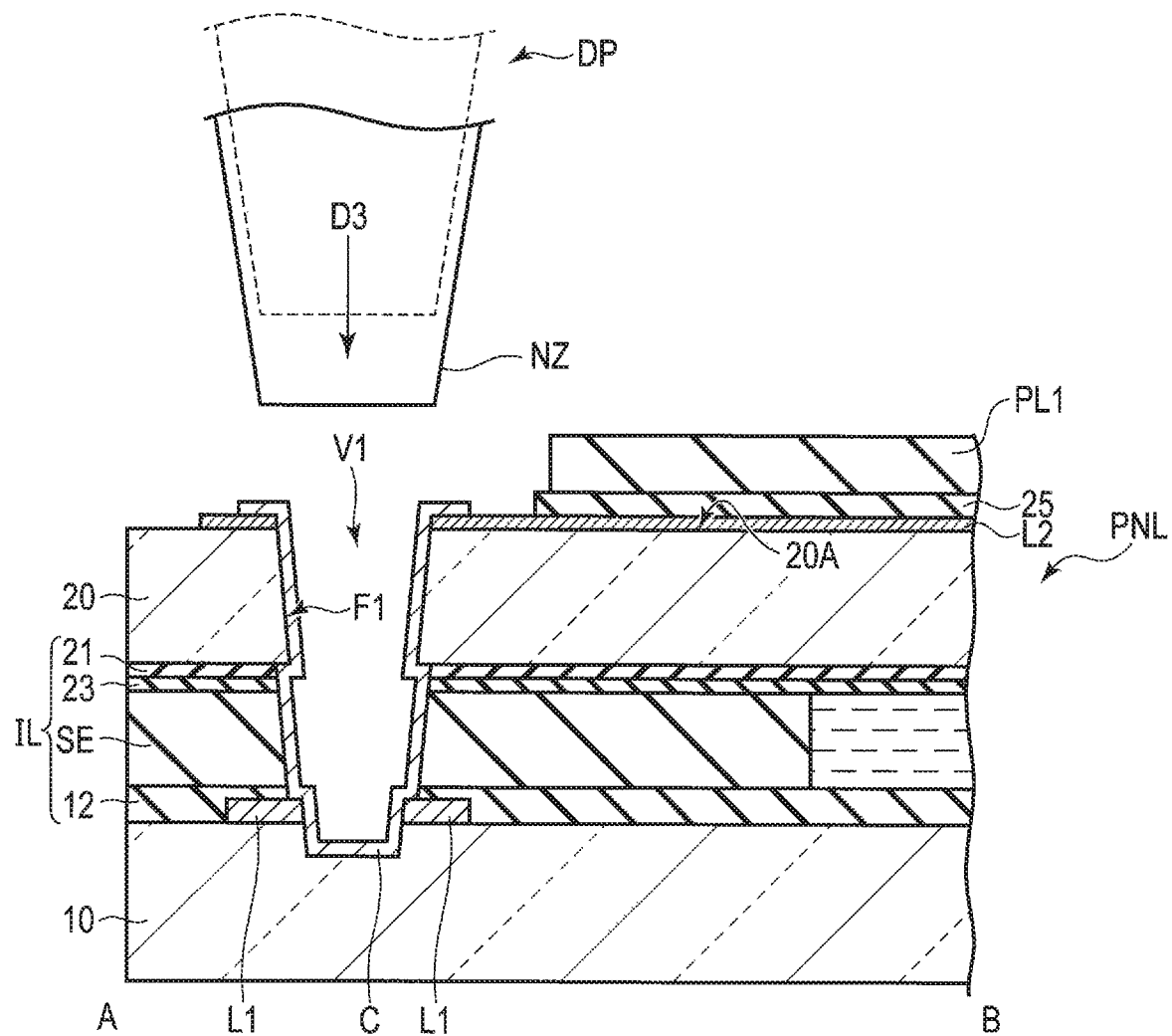
FIG. 26 is a diagram illustrating another step in a method of manufacturing the display device of the third embodiment.

Next, as shown in FIG. 26, a nozzle NZ of a dispenser DP is descended towards the hole V1. In the example illustrated, the nozzle NZ is descended along a direction D3 perpendicular to the upper surface 20A. The direction D3 is a direction parallel to the third direction Z. Here, the nozzle NZ opposes the hole V1 along the third direction Z.

Figure 27:
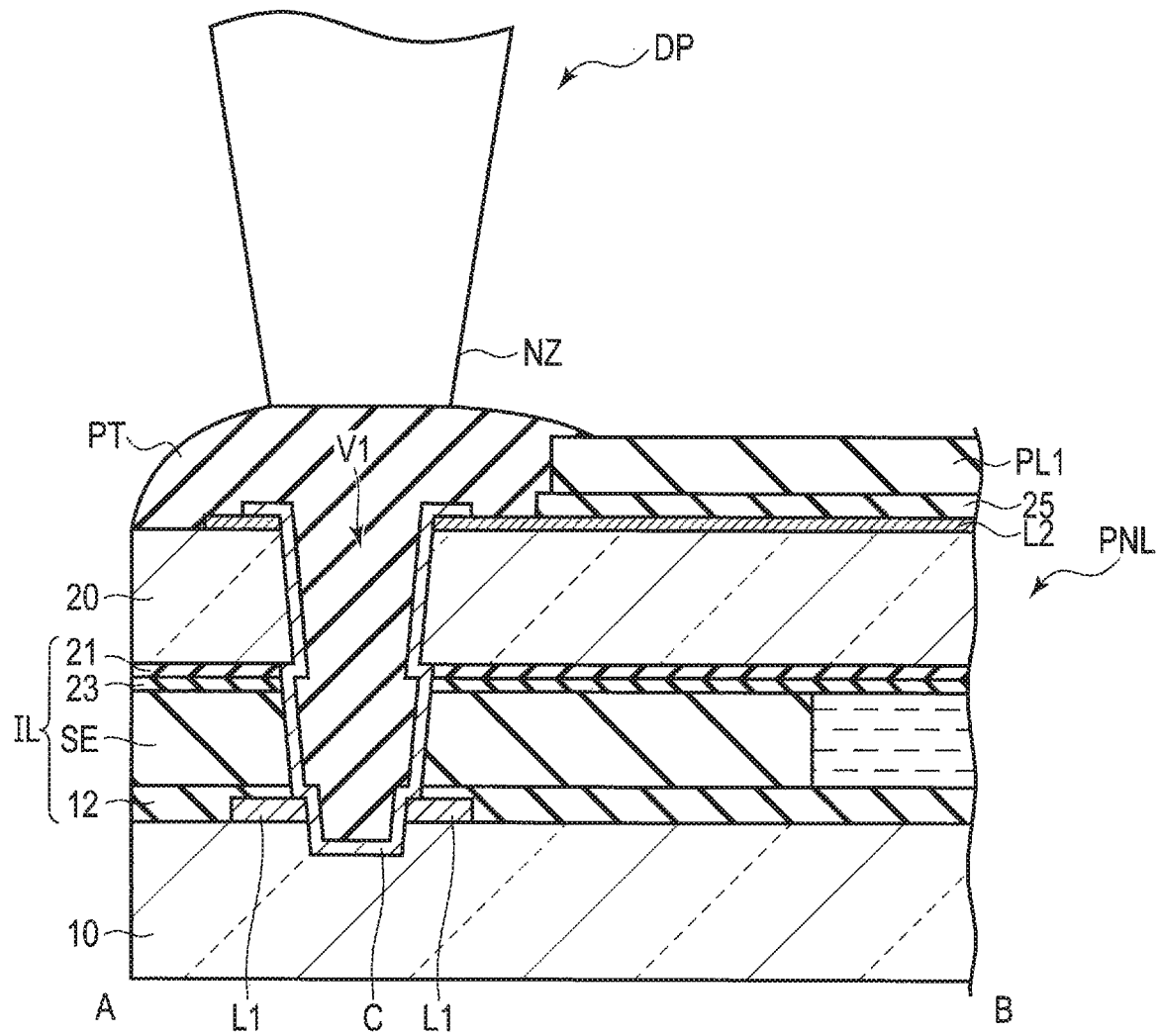
FIG. 27 is a diagram illustrating another step in a method of manufacturing the display device of the third embodiment.

Next, as shown in FIG. 27, the protective member PT is dispensed from the nozzle NZ to fill the hole V1 with the protective member PT. Then, the nozzle NZ is pulled upwards while holding the dispensing of the protective member PT from the nozzle NZ. Thus, after disposing the polarizer PL1, the protective member PT is formed, and thus the position where the protective member PT is applied can be determined based on the position of the polarizer PL1. Moreover, as compared to the case where the protective member PT is formed prior to the polarizer PL1, it is possible to prevent the reduction of the margin of the position where the polarizer PL1 is attached. Furthermore, even if the attachment position of the polarizer PL1 is displaced, a region where the protective member PT is to be applied can be reserved.

Figure 28:
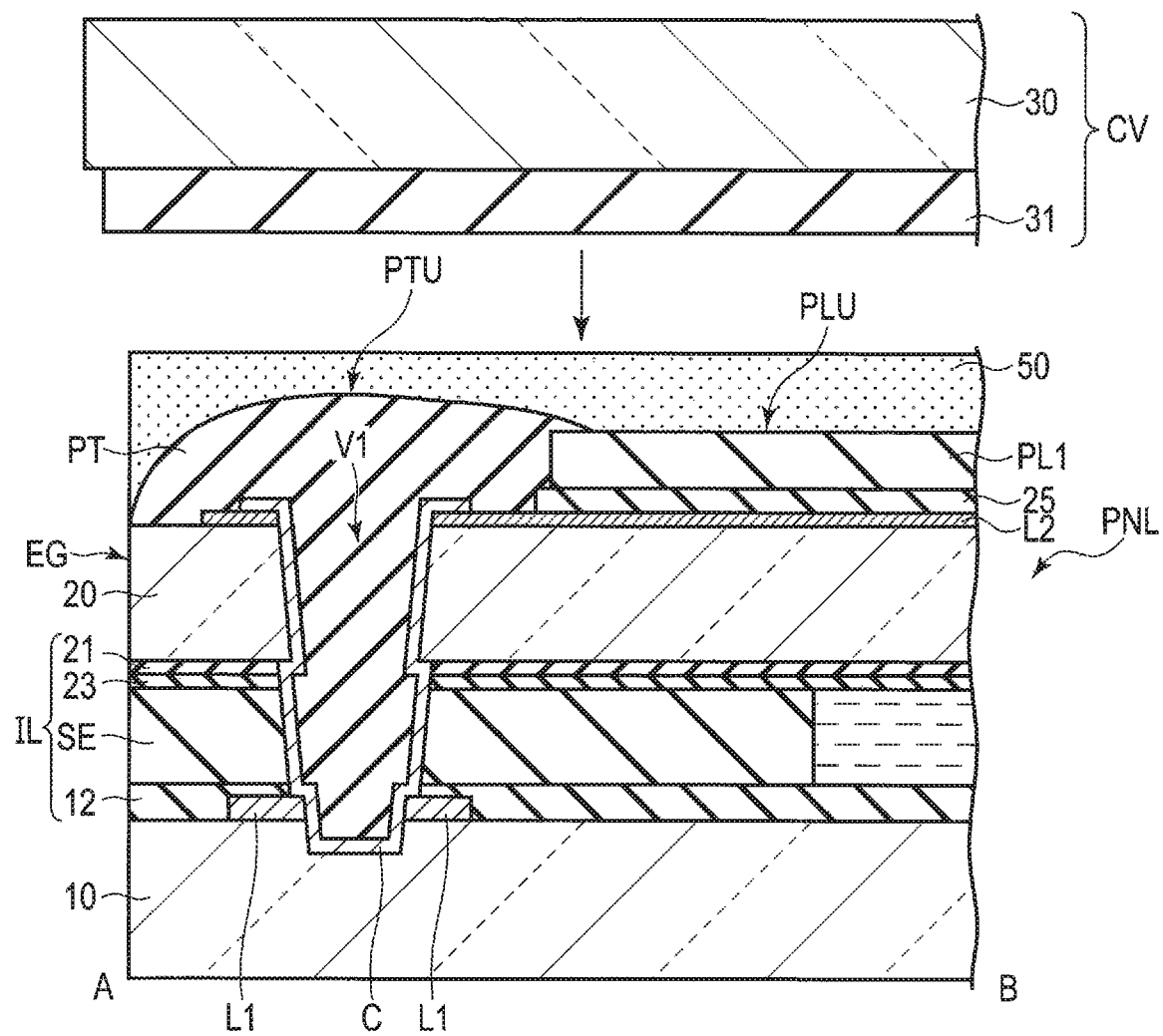
FIG. 28 is a diagram illustrating another step in a method of manufacturing the display device of the third embodiment.

Next, as shown in FIG. 28, the adhesive layer 50 is applied onto the upper surface PLU of the polarizer PL1 and the upper surface PTU of the protective member PT. Then, the cover CV is adhered onto the upper surface PLU and the upper surface PTU.

Figure 29:
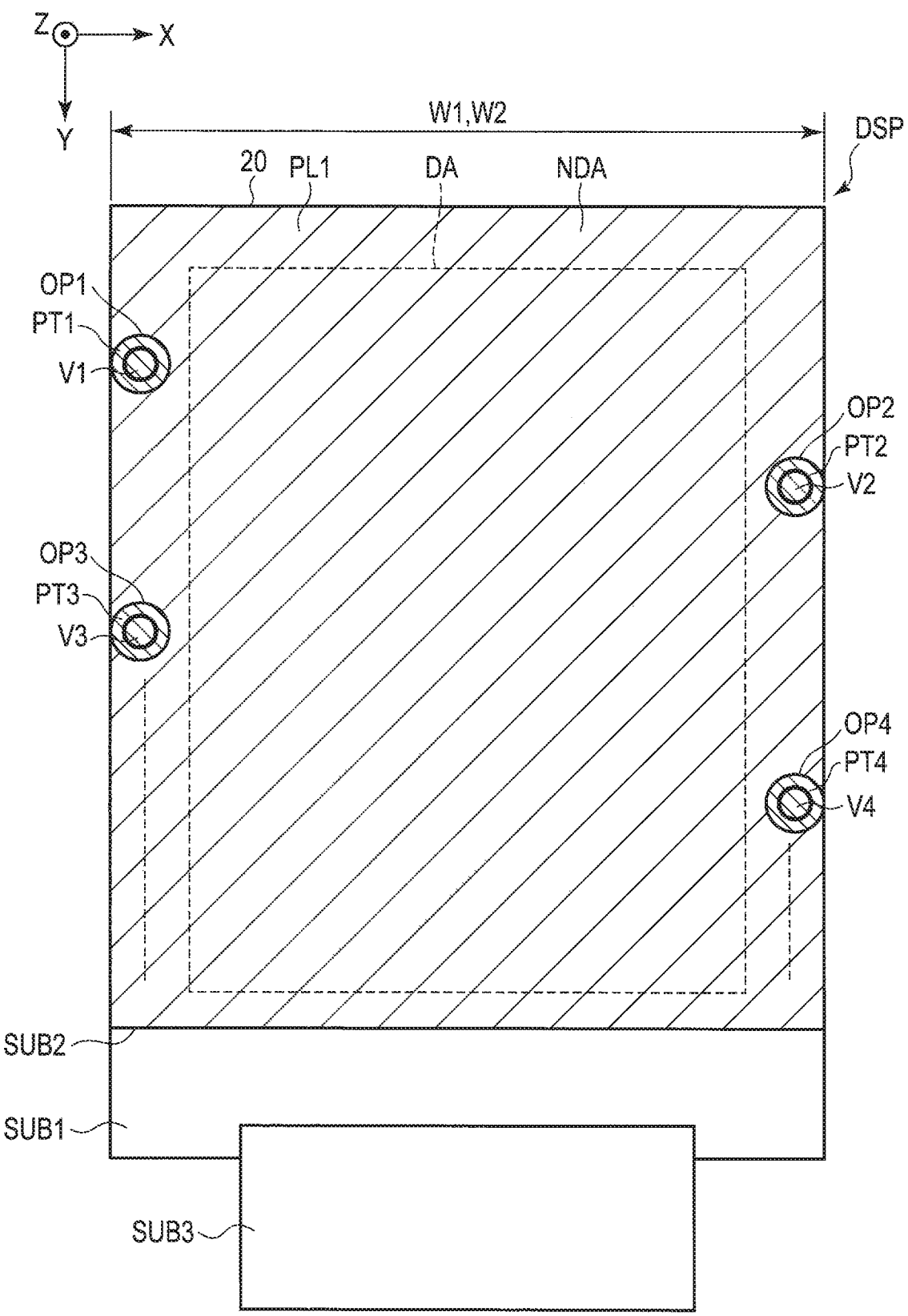
FIG. 29 is a cross-sectional view showing a second configuration example of the display device of the third embodiment.

FIG. 29 is a plan view showing a second configuration example of the display device DSP of the third embodiment. The structure shown in FIG. 29 is different from that of FIG. 24 in that a width W1 of the polarizer PL1 along the first direction X and a width W2 of the second base 20 along the first direction X are equal to each other.

The polarizer PL1 comprises openings OP1, OP2, . . . , which penetrate the polarizer PL1 in positions which overlap the holes V1, V2, . . . , respectively. The openings OP1, OP2, . . . , each comprise a closed circumferential edge such as of circular. The protection members PT1 and PT2 are located in positions which overlap the opening OP1, OP2, . . . , respectively. Thus, the polarizer PL1 does not overlap the protective member PT, and thus an advantageous effect similar to that described above can be obtained.

FIG. 30 is a plan view showing a third configuration example of the display device DSP of the third embodiment. The structure shown in FIG. 30 is different from that of FIG. 29 in the shape of the openings OP.

The openings OP1 and OP3 each extend to positions which overlap the end portion 201E of the second base 20. The openings OP2 and OP4 each extend to positions which overlap the end portion 202E of the second base 20. That is, the circumferential edges of the openings OP are not closed, and are partially connected to the end portions 201E and 202E. The protective members PT1 and PT3 each extend to positions which overlap the end portion 201E of the second base 20. The protective members PT2 and PT4 each extend to positions which overlap the end portion 202E of the second base 20.

Even by the shape of the openings OP illustrated, the polarizer PL1 does not overlap the protective member PT, and thus an advantageous effect similar to that described above can be obtained.

Moreover, it is considered that the polarizer contracts slightly over years. In this embodiment, the openings OP do not interfere with the contraction. As a result, it is possible to prevent cracking of the polarizer, which may be caused by the contraction, or the like.

FIG. 31 is a cross-sectional view showing a fourth configuration example of the display device DSP of the third embodiment. The structure shown in FIG. 31 is different from that of FIG. 23 in that the display panel PNL comprises an organic electroluminescence (EL) element OLED. The structure of the display area DA shown in FIG. 31 is similar to that of the display area DA shown in FIG. 8, and therefore its explanation will be omitted. Thus, an organic electroluminescence element OLED is applicable also to the display area DA of the third embodiment.

In this embodiment, as the second base 20, such a structure of a glass base or a resin base can be adopted so as to provide the second conductive layer L2 thereon. Additionally, in this embodiment, the second base 20 may be considered as that constitutes one layer of a sealing film. In view of this, in this embodiment, as the second base 20, a single layer of an organic insulating layer or a multi-layered structure in which an organic insulating layer and an inorganic insulating layer are stacked one on another, can be adopted.

As explained above, according to the first to third embodiments, a display device capable of suppressing the deterioration in display quality can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a display panel including a first surface over a display portion and a non-display portion therearound;
   a cover including a second surface opposing the first surface; and
   an adhesive layer in contact with the first surface and the second surface,
   the first surface including a convexity projecting toward the cover in the non-display portion, and
   the second surface including a concavity overlapping the convexity,
   wherein the display panel comprises a first base, a second base, a first conductive layer located between the first base and the second base, an insulating layer located between the first conductive layer and the second base, a second conductive layer located between the adhesive layer and the second base, a hole penetrating the second base and the insulating layer, a connecting material electrically connecting the first conductive layer to the second conductive layer through the hole, a protective member capping the hole and projecting toward the adhesive layer as at least a part of the convexity and a polarizer, and
   wherein the polarizer forms the first surface and is located between the protective member and the adhesive layer.

2. The display device of claim 1, wherein
   the cover has a first thickness in the concavity and a second thickness around the concavity in the non-display portion, and
   the first thickness is less than the second thickness.

3. The display device of claim 1, wherein
   a width of the protective member is less than a width of the concavity in plan view.

4. The display device of claim 1, wherein
   the cover comprises a third base and a coloring layer located between the third base and the adhesive layer, and
   the coloring layer forms at least a part of the second surface.

5. The display device of claim 4, wherein
   the concavity is formed on the coloring layer,
   the coloring layer has a third thickness in the concavity and a fourth thickness around the concavity in the non-display portion, and
   the third thickness is less than the fourth thickness.

6. The display device of claim 4, wherein
   the third base has a fifth thickness in the concavity and a sixth thickness around the concavity in the non-display portion,
   the fifth thickness is less than the sixth thickness, and
   a thicknesses of the polarizer corresponding to the concavity and a thicknesses of the polarizer around the concavity are the same.

7. The display device of claim 4, further comprising a frame in contact with a lower surface of the third base in the non-display portion.

8. The display device of claim 1, wherein
   the first surface includes a plurality of convexities,
   the second surface includes a plurality of concavities, and
   the concavities overlap the convexities.

9. The display device of claim 1, wherein
   the first surface includes a plurality of convexities, and
   the concavity overlaps two or more of the convexities.

10. The display device of claim 1, wherein
    the display panel includes a plurality of holes in the non-display portion, and
    the protective member covers the plurality of holes.

11. The display device of claim 10, wherein
    the convexity of the protective member extends along a direction in which the plurality of holes are arranged.

12. A display device comprising:
    a display panel including a display portion and a non-display portion around the display portion,
    an adhesive layer disposed above the display panel,
    the display panel comprising:
    a first base;
    a second base;
    a first conductive layer located between the first base and the second base;
    an insulating layer located between the first conductive layer and the second base;
    a second conductive layer located on the second base;
    a hole penetrating the second base and the insulating layer;
    a connecting material electrically connecting the first conductive layer to the second conductive layer through the hole;

a protective member covering the connecting material, projecting toward the adhesive layer, formed of an insulating material, and being in contact with the connecting material; and a polarizer disposed on and overlapping the protective member, wherein the protective member has a first thickness on a side of the display portion with respect to the hole and a second thickness on an end portion side of the second base with respect to the hole, the first thickness is less than the second thickness, the thickness of the protecting member between the second base and the polarizer becomes thicker from the side of the display portion with respect to the hole to the end portion side of the second base with respect to the hole, and the protective member is disposed in the non-display portion and not disposed in the display portion.

13. The display device of claim 12, wherein
the protective member extends to an end portion of the second base.

14. The display device of claim 13, wherein
the protective member comprises a curvy outline in the side of the display portion in plan view.

* * * * *